(12) United States Patent
Umemoto et al.

(10) Patent No.: US 10,978,579 B2
(45) Date of Patent: Apr. 13, 2021

(54) SEMICONDUCTOR DEVICE

(71) Applicant: Murata Manufacturing Co., Ltd., Kyoto-fu (JP)

(72) Inventors: Yasunari Umemoto, Nagaokakyo (JP); Daisuke Tokuda, Nagaokakyo (JP); Tsunekazu Saimei, Nagaokakyo (JP); Hiroaki Tokuya, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 16/505,390

(22) Filed: Jul. 8, 2019

(65) Prior Publication Data

US 2019/0333887 A1 Oct. 31, 2019

Related U.S. Application Data

(63) Continuation of application No. 15/954,420, filed on Apr. 16, 2018, now Pat. No. 10,388,623, which is a (Continued)

(30) Foreign Application Priority Data

Jan. 10, 2014 (JP) .................. 2014-003197

(51) Int. Cl.
*H01L 29/737* (2006.01)
*H01L 29/417* (2006.01)
(Continued)

(52) U.S. Cl.
CPC ............ *H01L 29/737* (2013.01); *H01L 24/02* (2013.01); *H01L 24/05* (2013.01); *H01L 24/11* (2013.01);
(Continued)

(58) Field of Classification Search
CPC ......... H01L 24/02; H01L 24/03; H01L 24/05; H01L 24/11; H01L 24/13; H01L 24/16;
(Continued)

(56) References Cited

U.S. PATENT DOCUMENTS 5,436,497 A 7/1995 Miyauchi et al.
5,831,337 A 11/1998 Sato
(Continued)

FOREIGN PATENT DOCUMENTS

| JP | H08-279562 A | 10/1996 |
| JP | H11-265895 A | 9/1999 |
| JP | 2003-077930 A | 3/2003 |

OTHER PUBLICATIONS

International Search Report issued in PCT/JP2014/083354; dated Feb. 17, 2015.
(Continued)

*Primary Examiner* — Cheung Lee
(74) *Attorney, Agent, or Firm* — Studebaker & Brackett PC

(57) ABSTRACT

A semiconductor device that includes a bipolar transistor, wherein a third opening, through which a pillar bump and a second wiring line, which is electrically connected to an emitter layer, contact each other, is shifted in a longitudinal direction of the emitter layer away from a position at which the third opening would be directly above the emitter layer. The third opening is arranged, with respect to the emitter layer, such that an end portion of the emitter layer in the longitudinal direction of the emitter layer and the edge of the opening of the third opening are substantially aligned with each other.

20 Claims, 27 Drawing Sheets

Related U.S. Application Data continuation of application No. 15/361,336, filed on Nov. 25, 2016, now Pat. No. 9,991,217, which is a continuation of application No. 15/202,749, filed on Jul. 6, 2016, now Pat. No. 9,508,669, which is a continuation of application No. PCT/JP2014/083354, filed on Dec. 17, 2014.

(51) Int. Cl.

| | | |
|---|---|---|
| *H01L 29/732* | (2006.01) | |
| *H01L 23/00* | (2006.01) | |
| *H01L 29/06* | (2006.01) | |
| *H01L 29/08* | (2006.01) | |
| *H01L 29/66* | (2006.01) | |
| *H01L 29/20* | (2006.01) | |
| *H01L 29/205* | (2006.01) | |

(52) U.S. Cl.
CPC .............. *H01L 24/13* (2013.01); *H01L 24/16* (2013.01); *H01L 29/0692* (2013.01); *H01L 29/0817* (2013.01); *H01L 29/20* (2013.01); *H01L 29/205* (2013.01); *H01L 29/41708* (2013.01); *H01L 29/6631* (2013.01); *H01L 29/66234* (2013.01); *H01L 29/66242* (2013.01); *H01L 29/66318* (2013.01); *H01L 29/732* (2013.01); *H01L 29/7371* (2013.01); *H01L 29/7375* (2013.01); *H01L 29/7378* (2013.01); *H01L 24/03* (2013.01); *H01L 29/66272* (2013.01); *H01L 2224/024* (2013.01); *H01L 2224/0235* (2013.01); *H01L 2224/0239* (2013.01); *H01L 2224/02331* (2013.01); *H01L 2224/02372* (2013.01); *H01L 2224/02373* (2013.01); *H01L 2224/03912* (2013.01); *H01L 2224/0401* (2013.01); *H01L 2224/05022* (2013.01); *H01L 2224/05024* (2013.01); *H01L 2224/05147* (2013.01); *H01L 2224/05166* (2013.01); *H01L 2224/05558* (2013.01); *H01L 2224/05559* (2013.01); *H01L 2224/05569* (2013.01); *H01L 2224/05572* (2013.01); *H01L 2224/05666* (2013.01); *H01L 2224/1134* (2013.01); *H01L 2224/131* (2013.01); *H01L 2224/13013* (2013.01); *H01L 2224/13022* (2013.01); *H01L 2224/13024* (2013.01); *H01L 2224/13026* (2013.01); *H01L 2224/13083* (2013.01); *H01L 2224/13111* (2013.01); *H01L 2224/13147* (2013.01); *H01L 2224/13155* (2013.01); *H01L 2224/13563* (2013.01); *H01L 2224/13611* (2013.01); *H01L 2224/16225* (2013.01); *H01L 2224/16227* (2013.01); *H01L 2224/16235* (2013.01); *H01L 2924/00012* (2013.01); *H01L 2924/01029* (2013.01); *H01L 2924/07025* (2013.01); *H01L 2924/10329* (2013.01); *H01L 2924/10337* (2013.01); *H01L 2924/10338* (2013.01); *H01L 2924/13051* (2013.01); *H01L 2924/13055* (2013.01); *H01L 2924/1423* (2013.01); *H01L 2924/351* (2013.01)

(58) Field of Classification Search
CPC . H01L 29/0692; H01L 29/0817; H01L 29/20; H01L 29/205; H01L 29/41708; H01L 29/66234; H01L 29/66242; H01L 29/66272; H01L 29/6631; H01L 29/66318; H01L 29/732; H01L 29/737; H01L 29/7371; H01L 29/7375; H01L 29/7378
See application file for complete search history.

(56) References Cited

U.S. PATENT DOCUMENTS

| | | |
|---|---|---|
| 5,864,169 A | 1/1999 | Shimura et al. |
| 7,723,753 B2 | 5/2010 | Sasaki et al. |
| 9,508,669 B2 * | 11/2016 | Umemoto ............... H01L 29/20 |
| 9,991,217 B2 | 6/2018 | Umemoto et al. |
| 10,388,623 B2 * | 8/2019 | Umemoto ............... H01L 24/13 |
| 2005/0258452 A1 | 11/2005 | Konishi et al. |
| 2008/0121938 A1 | 5/2008 | Morita et al. |
| 2008/0224174 A1 | 9/2008 | Sasaki et al. |
| 2010/0133586 A1 | 6/2010 | Min et al. |
| 2012/0119262 A1 | 5/2012 | Noort et al. |
| 2014/0312390 A1 | 10/2014 | Tsai et al. |

OTHER PUBLICATIONS

Written Opinion issued in PCT/JP2014/083354; dated Feb. 17, 2015.

* cited by examiner

FIG.27 -- PRIOR ART --

-- PRIOR ART --

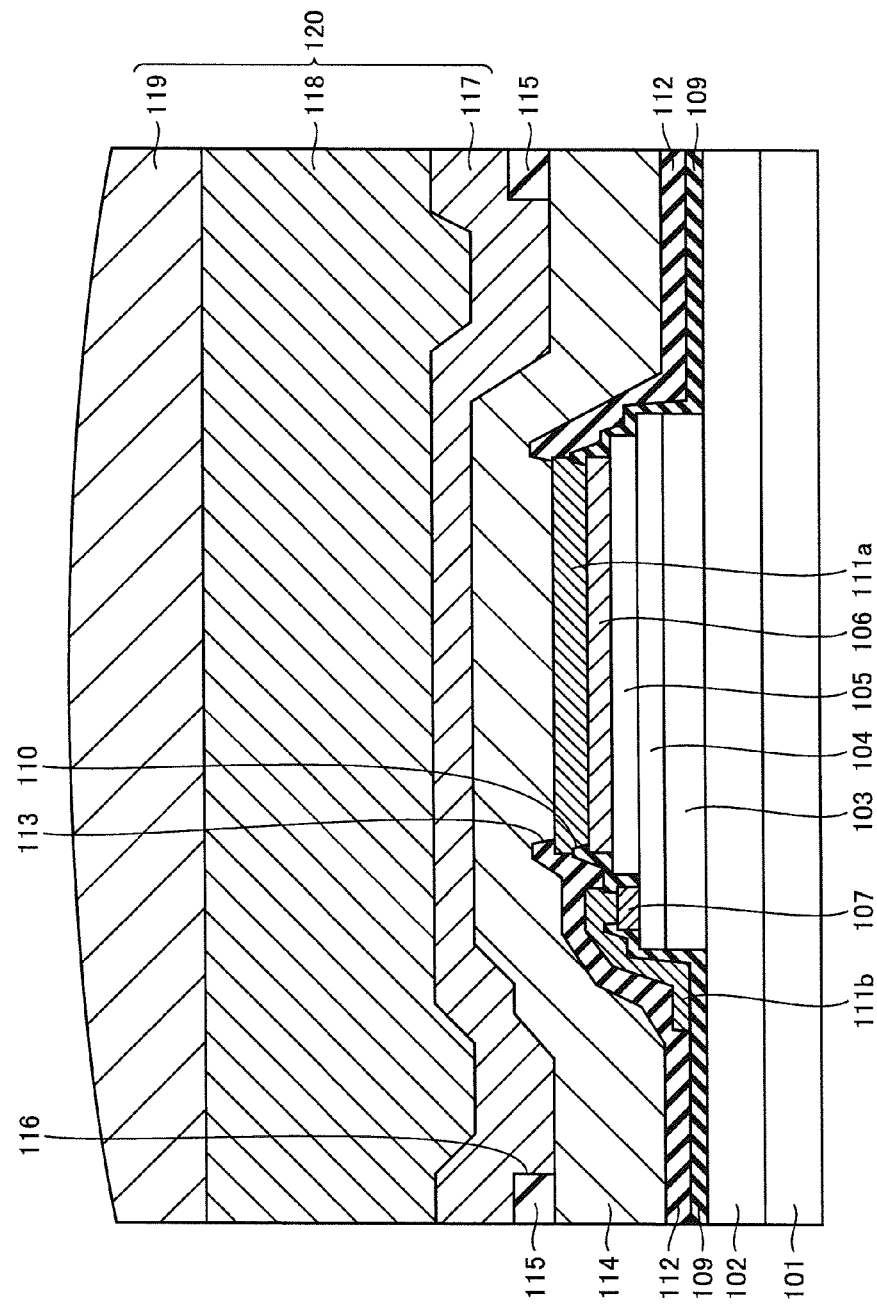
FIG.29 -- PRIOR ART --

SEMICONDUCTOR DEVICE

CROSS REFERENCE TO RELATED APPLICATIONS

This application is a continuation of U.S. patent application Ser. No. 15/954,420 filed Apr. 16, 2018, which is a continuation of U.S. patent application Ser. No. 15/361,336 filed Nov. 25, 2016, which is a continuation of U.S. patent application Ser. No. 15/202,749 filed Jul. 6, 2016, which is a continuation of International Application No. PCT/JP2014/083354 filed Dec. 17, 2014, and claims priority to Japanese Patent Application No. 2014-003197 filed Jan. 10, 2014, the entire content of which is incorporated herein by reference.

TECHNICAL FIELD

The present disclosure relates to a semiconductor device and in particular relates to a semiconductor device that includes a heterojunction bipolar transistor.

BACKGROUND ART

In recent years, heterojunction bipolar transistors have been used as the transistors that form a power amplification module of mobile terminals and so forth. This type of bipolar transistor is called a heterojunction bipolar transistor (HBT).

An example of a semiconductor device that includes such a bipolar transistor will be described. As illustrated in FIGS. 27, 28 and 29, in a bipolar transistor, a sub-collector layer 102 is formed so as to contact a semi-insulating GaAs substrate 101 and a collector layer 103 is formed so as to contact the sub-collector layer 102. A base layer 104 is formed so as to contact the collector layer 103 and an emitter layer 105 is formed so as to contact the base layer 104.

An emitter electrode 106 is formed so as to contact the emitter layer 105. A base electrode 107 is formed so as to contact the base layer 104. A collector electrode 108 is formed so as to contact the sub-collector layer 102. A first insulating film 109 is formed so as to cover the emitter electrode 106, the base electrode 107, the collector electrode 108 and so forth.

First wiring lines 111a, 111b and 111c are formed so as to contact the first insulating film. The first wiring line 111a is electrically connected to the emitter electrode 106, the first wiring line 111b is electrically connected to the base electrode 107 and the first wiring line 111c is electrically connected to the collector electrode 108 via first openings 110 formed in the first insulating film 109. A second insulating film 112 is formed so as to cover the first wiring lines 111a, 111b and 111c.

A second wiring line 114 is formed so as to contact the second insulating film. The second wiring line 114 is electrically connected to the emitter electrode 106 via a second opening 113 formed in the second insulating film 112. A passivation film 115 is formed so as to cover the second wiring line 114.

A pillar bump 120 is formed so as to contact the passivation film 115. The pillar bump 120 has a multilayer structure consisting of underbump metal 117, a metal post 118 and solder 119. The pillar bump 120 is electrically connected to the second wiring line 114 via a third opening 116 formed in the passivation film 115. The third opening 116 is formed such that the entirety of the bipolar transistor is located inside the region of the third opening 116. A bipolar transistor of the related art is formed as described above.

In a semiconductor device that includes such a bipolar transistor of the related art, the entirety of the bipolar transistor is disposed inside the region of the third opening 116 and as a result the pillar bump 120 is located directly above the emitter layer 105 with the emitter electrode 106, the first wiring line 111a and the second wiring line 114 interposed therebetween.

Consequently, the pillar bump 120 is disposed directly above the collector layer 103 etc., which are directly below the emitter layer 105 and are sources of heat in the bipolar transistor, and thermal resistance can be made small by making the distance from the collector layer 103 etc., which are directly below the emitter layer 105, to the pillar bump 120 be substantially as short as possible. As a result, heat generated in the bipolar transistor is caused to effectively radiate to the pillar bump 120 and an increase in the junction temperature of the bipolar transistor can be suppressed.

Japanese Unexamined Patent Application Publication No. 2003-77930 is an example of a document that discloses a semiconductor device in which a stud bump is disposed directly above a bipolar transistor as a bump.

SUMMARY

Technical Problem

As described above, in the bipolar transistor of the related art, thermal resistance can be reduced by disposing the pillar bump 120 directly above the emitter layer 105. However, the inventors ascertained that a problem occurs in this structure when the long-term reliability is evaluated by applying current to the bipolar transistor at a high temperature.

That is, thermal stress is generated inside the emitter layer and so forth due to the difference between the rate of thermal expansion (thermal expansion coefficient) of the emitter layer and so forth (GaAs layers) and the rate of thermal expansion (thermal expansion coefficient) of the pillar bump, and it was determined that the current gain of the bipolar transistor falls in a very short period of time due to this thermal stress.

For example, in a structure in which a bipolar transistor is mounted face down on a mounting substrate such as a printed circuit board (PCB) substrate as a structure for connecting the pillar bump, the current gain of the bipolar transistor is degraded in a very short period of time when a current of 20-50 kA/cm$^2$ flows in an environment with a temperature of 150° C. or higher.

Specifically, compared with a structure in which a bipolar transistor not having a pillar bump is mounted face up so as to be electrically connected to the outside via typical wire bonding, for the face down mounting structure, the reliability lifetime is shortened to $\frac{1}{10}$-$\frac{1}{100}$ that in the case of the face up structure when an environmental test is conducted under the same conditions.

The present disclosure was made in order to solve the above-described problem and it is an object thereof to provide a semiconductor device that includes a bipolar transistor that can relieve thermal stress while suppressing an increase in thermal resistance.

Solution to Problem

A semiconductor device according to the present disclosure includes a heterojunction bipolar transistor. The bipolar transistor includes a collector layer, a base layer, an emitter layer, an emitter wiring line, an insulating film and a bump. The base layer is on the collector layer. The emitter layer is on the base layer. The emitter wiring line is electrically connected to the emitter layer. The insulating film covers the emitter wiring line and has an opening through which the emitter wiring line is exposed. The bump is on the insulating film so as to bury the opening and electrically connect to the emitter layer via the emitter wiring line. The emitter wiring line covers the entirety of the emitter layer in plan view.

In the semiconductor device according to the present disclosure, the opening is arranged with respect to the emitter layer at a position between a first arrangement in which an overlapping ratio of an area by which the emitter layer and a region inside the opening overlap in plan view to an area of the emitter layer is less than ½ and a second arrangement in which the opening is shifted in a direction away from the emitter layer with respect to the first arrangement and an end portion of the emitter layer is located in a region in which the bump and the insulating film overlap in plan view. Consequently, thermal stress can be relieved while suppressing an increase in thermal resistance.

It is preferable that the opening be arranged with respect to the emitter layer at a position that is between a third arrangement in which the overlapping ratio is less than ¼ and the second arrangement.

As a result, thermal stress can be more effectively relieved.

As a specific arrangement, it is preferable that the emitter layer extend with a width and that the bump be arranged, with respect to the emitter layer, such that a center of the bump is positioned in plan view at a position that is separated from a center of the emitter layer in a longitudinal direction in which the emitter layer extends.

Furthermore, it is preferable that a rewiring line be electrically connected to the emitter wiring line located in the opening and over the insulating film.

Thus, the degree of freedom in arranging, for example, a pad that is electrically connected to the rewiring line can be increased.

Another semiconductor device according to the present disclosure includes a heterojunction bipolar transistor. The bipolar transistor includes a collector layer, a base layer, an emitter layer, an emitter wiring line, a rewiring line, an insulating film and a bump. The base layer is formed on the collector layer. The emitter layer is formed on the base layer. The emitter wiring line is electrically connected to the emitter layer. The rewiring line is connected to the emitter wiring line. The insulating film covers the rewiring line and has an opening through which the emitter wiring line is exposed. The bump is on the insulating film so as to bury the opening and electrically connect to the emitter layer via the emitter wiring line. The emitter wiring line covers the entirety of the emitter layer in plan view.

In the other semiconductor device according to the present disclosure, the opening is arranged with respect to the emitter layer, at a position between a first arrangement in which an overlapping ratio of an area by which the emitter layer and a region inside the opening overlap in plan view to an area of the emitter layer is less than ½ and a second arrangement in which the opening is shifted in a direction away from the emitter layer with respect to the first arrangement and an end portion of the emitter layer is located in a region in which the bump and the insulating film overlap in plan view. Consequently, thermal stress can be relieved while suppressing an increase in thermal resistance.

Yet another semiconductor device according to the present disclosure includes a heterojunction bipolar transistor. The bipolar transistor includes a collector layer, a base layer, an emitter layer, an emitter wiring line, an insulating film and a bump. The base layer is formed on the collector layer. The emitter layer is formed on the base layer. The emitter wiring line is electrically connected to the emitter layer. The insulating film covers the emitter wiring line and has an opening through which the emitter wiring line is exposed. The bump is on the insulating film so as to bury the opening and electrically connect to the emitter layer via the emitter wiring line. The bump is arranged, with respect to the emitter layer, such that a center of the bump is positioned, in plan view, offset from a center of the emitter layer in a longitudinal direction in which the emitter layer extends.

Still another semiconductor device according to the present disclosure includes a heterojunction bipolar transistor. The bipolar transistor includes a collector layer, a base layer, an emitter layer, an emitter wiring line, a rewiring line, an insulating film and a bump. The base layer is formed on the collector layer. The emitter layer is formed on the base layer. The emitter wiring line is electrically connected to the emitter layer. The rewiring line electrically connects to the emitter wiring line. The insulating film covers the rewiring line and has an opening through which the rewiring line is exposed. The bump is on the insulating film so as to bury the opening and electrically connect to the emitter layer via the emitter wiring line. The bump is arranged, with respect to the emitter layer, such that a center of the bump is positioned, in plan view, offset from a center of the emitter layer in a longitudinal direction in which the emitter layer extends.

Another semiconductor device according to the present disclosure includes a heterojunction bipolar transistor. The bipolar transistor includes a collector layer, a base layer, an emitter layer, an emitter wiring line, an insulating film and a bump. The base layer is formed on the collector layer. The emitter layer is formed on the base layer. The emitter wiring line is electrically connected to the emitter layer. The insulating film covers the emitter wiring line and has an opening through which the emitter wiring line is exposed. The bump is on the insulating film so as to bury the opening and electrically connect to the emitter layer via the emitter wiring line. The opening is arranged, with respect to the emitter layer, at a position between a first arrangement in which an overlapping ratio of an area by which the emitter layer and a region inside the opening overlap in plan view to an area of the emitter layer is less than ½ and a second arrangement in which the opening is shifted in a direction away from the emitter layer with respect to the first arrangement and an end portion of the emitter layer is located in a region in which the bump and the passivation film overlap in plan view.

In the above other semiconductor device according to the present disclosure, the opening is arranged, with respect to the emitter layer, at position between a third arrangement in which the overlapping ratio is less than ¼ and the second arrangement.

Another semiconductor device according to the present disclosure includes a heterojunction bipolar transistor. The bipolar transistor includes a collector layer, a base layer, an emitter layer, an emitter wiring line, a rewiring line, an insulating film and a bump. The base layer is formed on the collector layer. The emitter layer is formed on the base layer. The emitter wiring line is electrically connected to the emitter layer. The rewiring line electrically connects to the emitter wiring line. The insulating film covers the rewiring line and has an opening through which the rewiring line is exposed. The bump is on the insulating film so as to bury the opening and electrically connect to the emitter layer via the emitter wiring line. The opening is arranged, with respect to the emitter layer, at a position between a first arrangement in which an overlapping ratio of an area by which the emitter layer and a region inside the opening overlap in plan view to an area of the emitter layer is less than ½ and a second arrangement in which the opening is shifted in a direction away from the emitter layer with respect to the first arrangement and an end portion of the emitter layer is located in a region in which the bump and the insulating film overlap in plan view.

In the above other semiconductor device according to the present disclosure, the opening is arranged, with respect to the emitter layer, at position between a third arrangement in which the overlapping ratio is less than ¼ and the second arrangement.

Thus, thermal stress caused by a difference between the rate of thermal expansion of the bipolar transistor and the rate of thermal expansion of the mounting substrate can be relieved.

BRIEF DESCRIPTION OF DRAWINGS

FIG. 29 is a sectional view taken along sectional line XXIX-XXIX depicted in FIG. 27.

DETAILED DESCRIPTION

Embodiment 1

Figure 1:
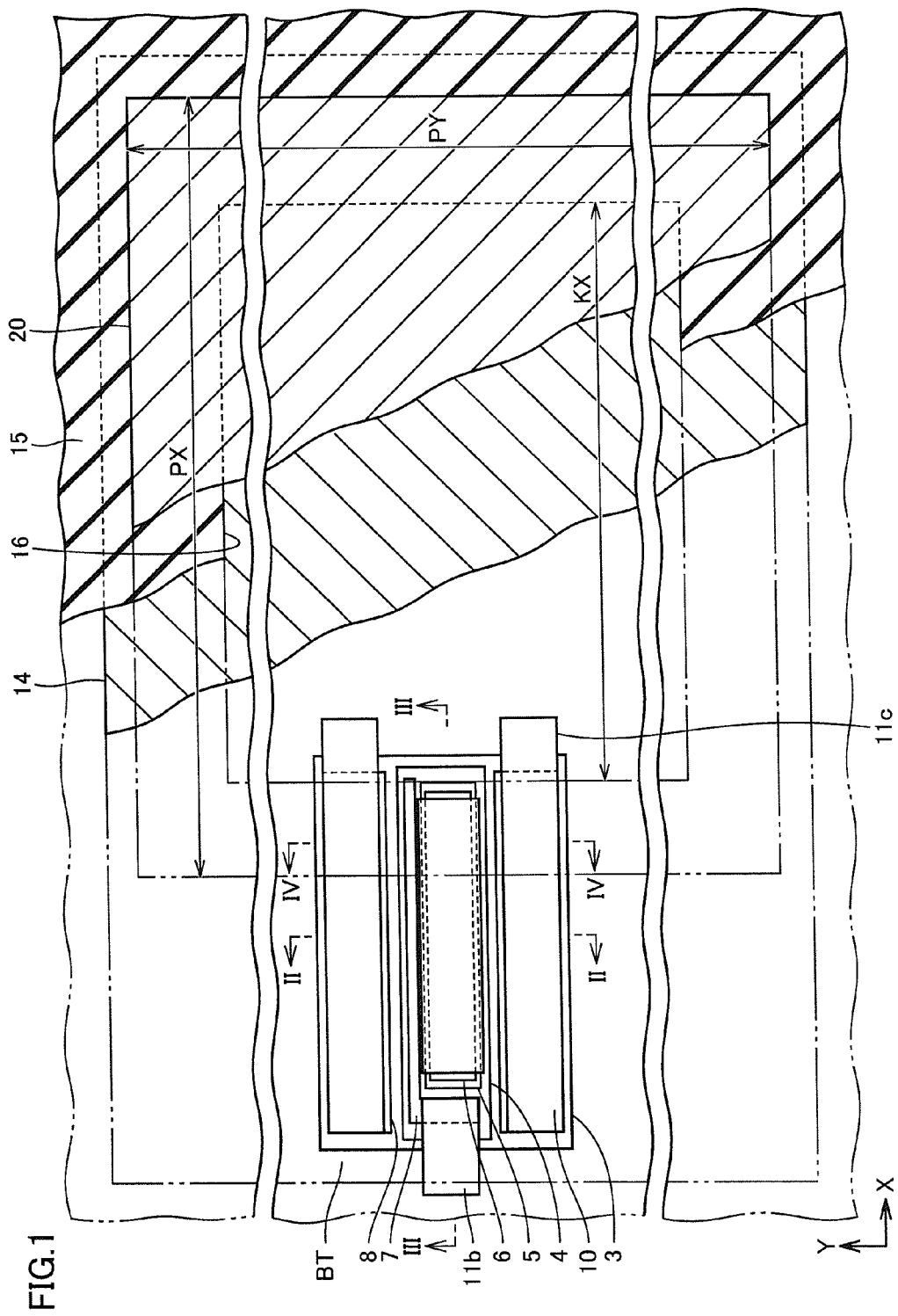
FIG. 1 is a plan view of a semiconductor device according to embodiment 1 of the present disclosure.
Figure 2:
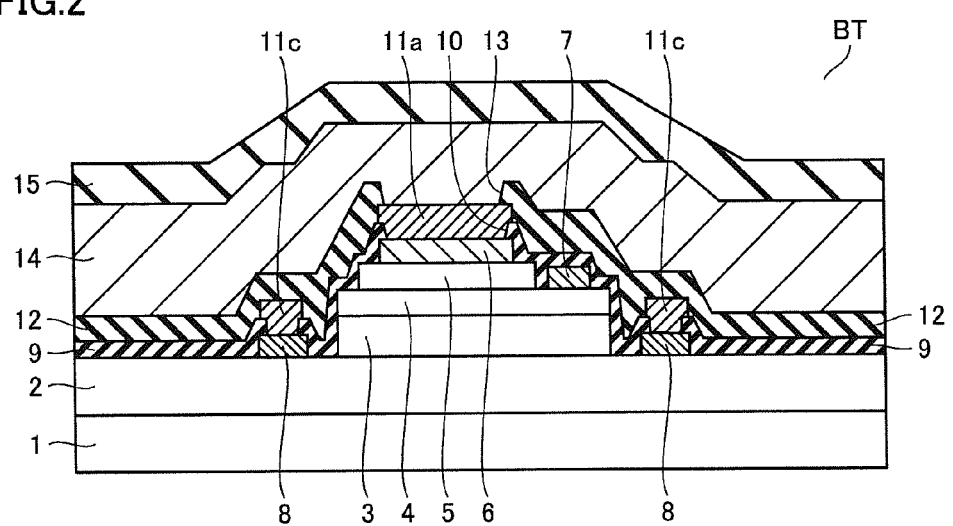
FIG. 2 is a sectional view taken along sectional line II-II depicted in FIG. 1 in the same embodiment.

Here, a first example of a semiconductor device that includes a heterojunction bipolar transistor will be described.

As illustrated in FIGS. 1, 2, 3 and 4, in a semiconductor device that includes a bipolar transistor BT, a sub-collector layer 2 (n-type GaAs, Si concentration $5 \times 10^{18}$ cm$^{-3}$, film thickness: 0.6 μm) is formed so as to contact the surface of a semi-insulating GaAs substrate 1. A collector layer 3 (n-type GaAs, Si concentration: $5 \times 10^{15}$ cm$^{-3}$, film thickness: 1.0 μm) is formed so as to contact the sub-collector layer 2. A base layer 4 (p-type GaAs, C concentration $4 \times 10^{19}$ cm$^{-3}$, film thickness: 100 nm) is formed so as to contact the collector layer 3.

A mesa-shaped emitter layer 5 is formed so as to contact the base layer 4. The emitter layer 5 has a structure obtained by stacking, in order from the base layer 4 side, an n-type In$_x$Ga$_{1-x}$P layer (In composition ratio x=0.5, Si concentration: $3 \times 10^{17}$ cm$^{-3}$, film thickness: 30 nm), an n-type GaAs layer (Si concentration: $3 \times 10^{17}$ cm$^{-3}$, film thickness: 90 nm), an n-type GaAs contact layer (Si concentration: $1 \times 10^{19}$ cm$^{-3}$, film thickness: 50 nm) and an n-type In$_x$Ga$_{1-x}$As contact layer (In composition ratio x=0.5, Si concentration: $1 \times 10^{19}$ cm$^{-3}$, film thickness: 50 nm).

An emitter electrode 6 is formed so as to contact the emitter layer 5. A collector electrode 8 is formed so as to contact the sub-collector layer 2. A base electrode 7 is formed so as to contact the base layer 4. The emitter electrode 6 is formed of a WSi film (Si molar ratio: 0.3, film thickness: 0.3 μm). The base electrode 7 is formed by stacking a Ti film (film thickness: 50 nm), a Pt film (film thickness: 50 nm) and a Au film (film thickness: 200 nm). The collector electrode 8 is formed by stacking a AuGe film (film thickness: 60 nm), a Ni film (film thickness: 10 nm) and a Au film (film thickness: 200 nm).

A first insulating film 9 (SiN, film thickness: 50 nm) is formed so as to cover the emitter electrode 6, the base electrode 7 and the collector electrode 8. A first opening 10, through which the emitter electrode 6 etc. are exposed, is formed in the first insulating film 9. A first wiring line 11a that is electrically connected to the emitter electrode 6, a first wiring line 11b that is electrically connected to the base electrode 7 and a first wiring line 11c that is electrically connected to the collector electrode 8 via the first opening 10 are formed so as to contact the first insulating film 9. The first wiring lines 11a, 11b and 11c are formed of a metal film (Au, film thickness: 1 µm), for example.

A second insulating film 12 (SiN, film thickness: 100 nm) is formed so as to cover the first wiring lines 11a, 11b and 11c. A second opening 13, through which the first wiring line 11a is exposed, is formed in the second insulating film 12. A second wiring line 14 (Au, film thickness: 4 µm), which is electrically connected to the first wiring line 11a via the second opening 13, is formed so as to contact the second insulating film 12. As illustrated in FIG. 1, the second wiring line 14 is formed so as to cover the entirety of the bipolar transistor including the collector layer 3, the base layer 4 and the emitter layer 5.

Figure 3:
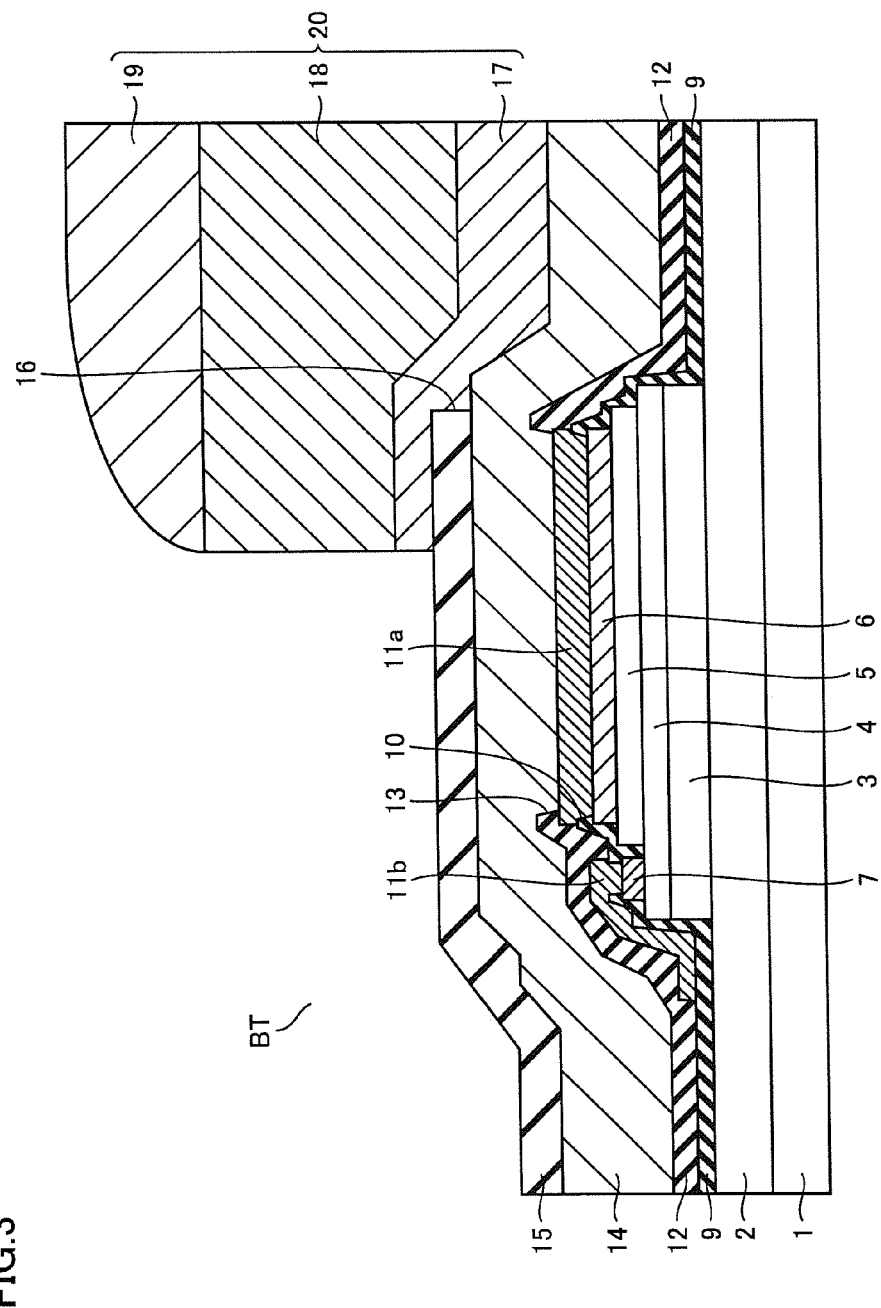
FIG. 3 is a sectional view taken along sectional line III-III depicted in FIG. 1 in the same embodiment.
Figure 4:
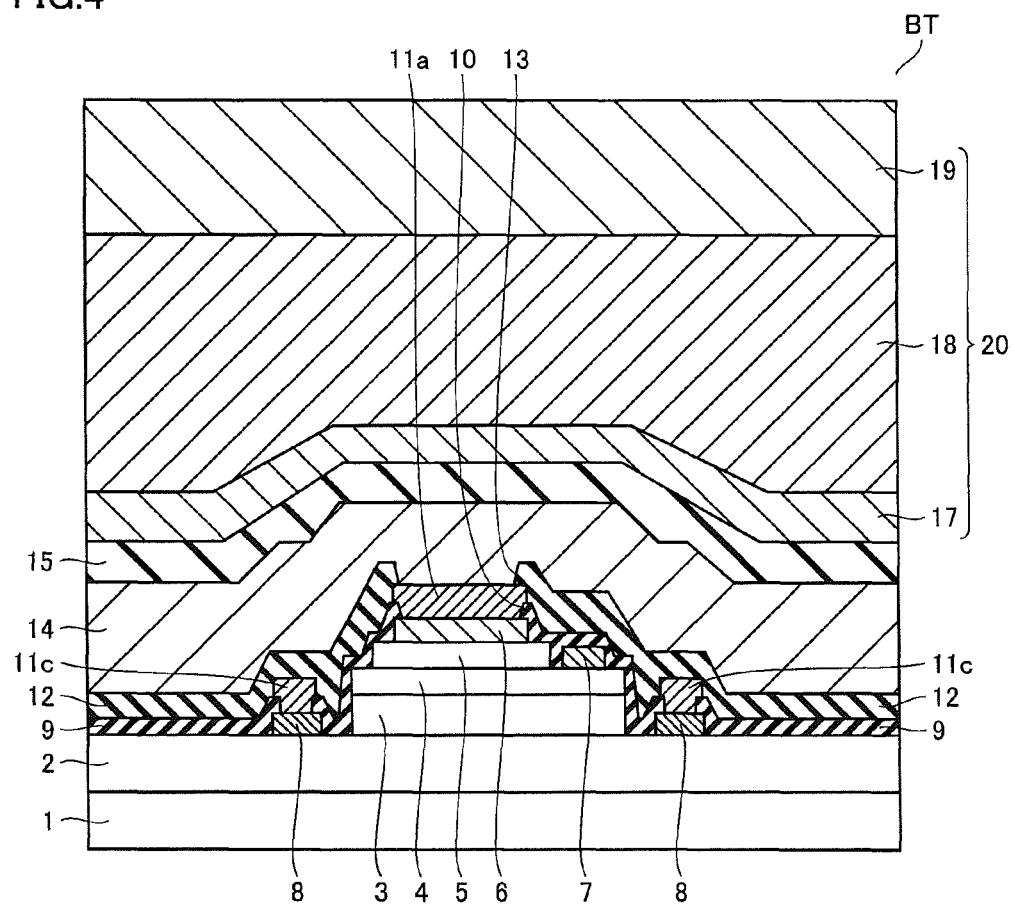
FIG. 4 is a sectional view taken along sectional line IV-IV depicted in FIG. 1 in the same embodiment.

A passivation film 15 (SiN, film thickness: 500 nm) is formed so as to cover the second wiring line 14. A third opening 16, through which the second wiring line 14 is exposed, is formed in a prescribed region of the passivation film 15. A pillar bump 20 is formed so as to bury the third opening 16 and so as to contact the part of the passivation film 15 located along the edge of the opening of the third opening 16. As illustrated in FIGS. 3 and 4, the pillar bump 20 has a multilayer structure consisting of underbump metal (UBM) 17 (Ti, film thickness: 150 nm), a metal post 18 (Cu, film thickness: 50 µm) and solder 19 (Sn, film thickness: 30 µm). A barrier metal layer, which is for preventing interdiffusion of Ni and the like, may be formed between the metal post 18 and the solder 19.

Next, the arrangement relationship between the pillar bump 20, the third opening 16 and the bipolar transistor (emitter layer 5) will be described in detail.

As illustrated in FIG. 1, the emitter layer 5 forms a rectangular emitter. Taking the longitudinal direction of the emitter layer 5 to be an X direction and a direction perpendicular to the longitudinal direction to be a Y direction, the length (width) of the emitter layer 5 in the Y direction is set to be 4 µm and the length of the emitter layer 5 in the X direction (longitudinal direction) is set to be 28 µm. A length PX of the pillar bump 20 in the X direction is set to be 75 µm and a length PY of the pillar bump 20 in the Y direction is set to be around 75 to 500 µm. A length KX of the third opening 16 in the X direction is set to be 55 µm. In addition, as illustrated in FIG. 3, the third opening 16 is arranged with respect to the emitter layer 5 such that an end portion of the emitter layer 5 in the longitudinal direction of the emitter layer 5 and the edge of the opening of the third opening 16 are substantially aligned with each other.

In the semiconductor device that includes the bipolar transistor described above, the third opening 16, through which the pillar bump 20 and the second wiring line 14, which is electrically connected to the emitter layer 5, contact each other, is arranged at a position that is shifted in the longitudinal direction of the emitter layer 5 away from a position where the third opening 16 would be directly above the emitter layer 5. As a result, thermal stress acting on the bipolar transistor can be relieved. This will be explained below.

Figure 5:
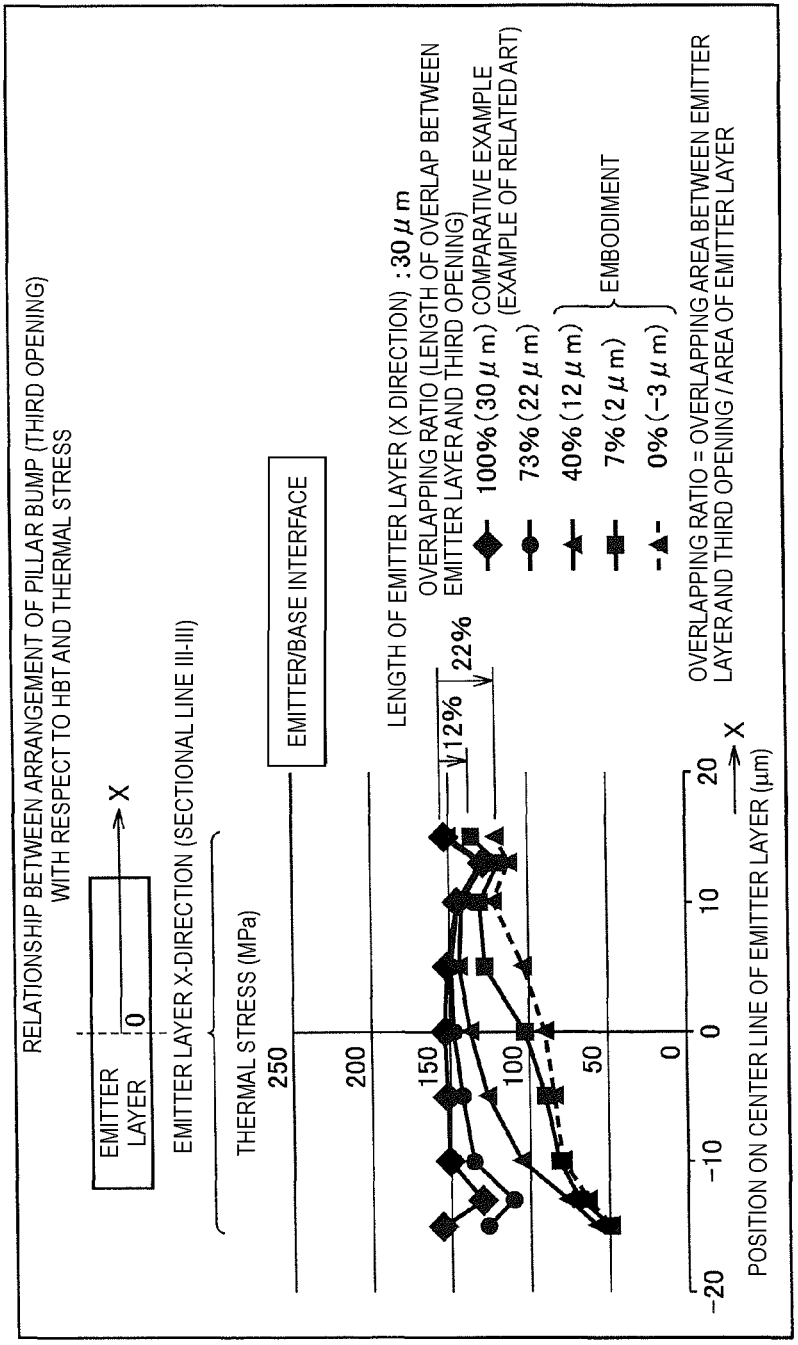
FIG. 5 is a graph illustrating the relationship between the arrangement of a pillar bump with respect to a bipolar transistor, and thermal stress.

The inventors recognized that thermal stress is caused by a difference between the rate of thermal expansion of the emitter layer 5 etc. (GaAs layers) and the rate of thermal expansion of the pillar bump 20. A graph obtained by evaluating the relationship between thermal stress and the arrangement of the pillar bump 20 (third opening 16) with respect to the bipolar transistor BT by using a simulation is illustrated in FIG. 5. The horizontal axis represents the position in the longitudinal direction of the emitter layer with the center of the emitter layer (center in longitudinal direction and width direction) serving as the origin. The vertical axis represents thermal stress in the emitter layer. The length of the emitter layer is set to be 30 µm. Furthermore, the ratio of an overlapping area, in plan view, between the emitter layer and the third opening with respect to the area of the emitter layer in plan view is called an overlapping ratio.

Figure 27:
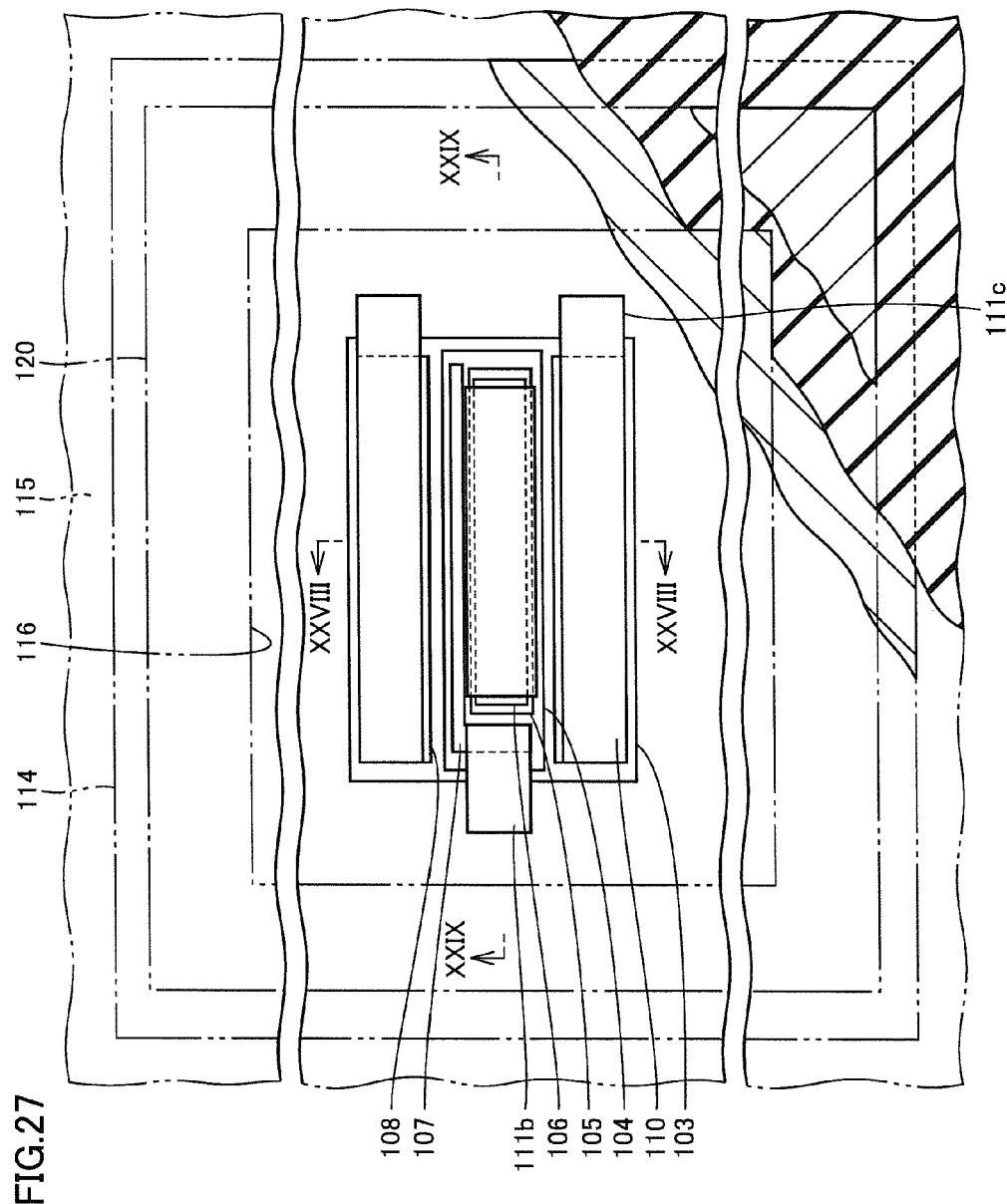
FIG. 27 is a plan view of a semiconductor device of the related art.
Figure 28:
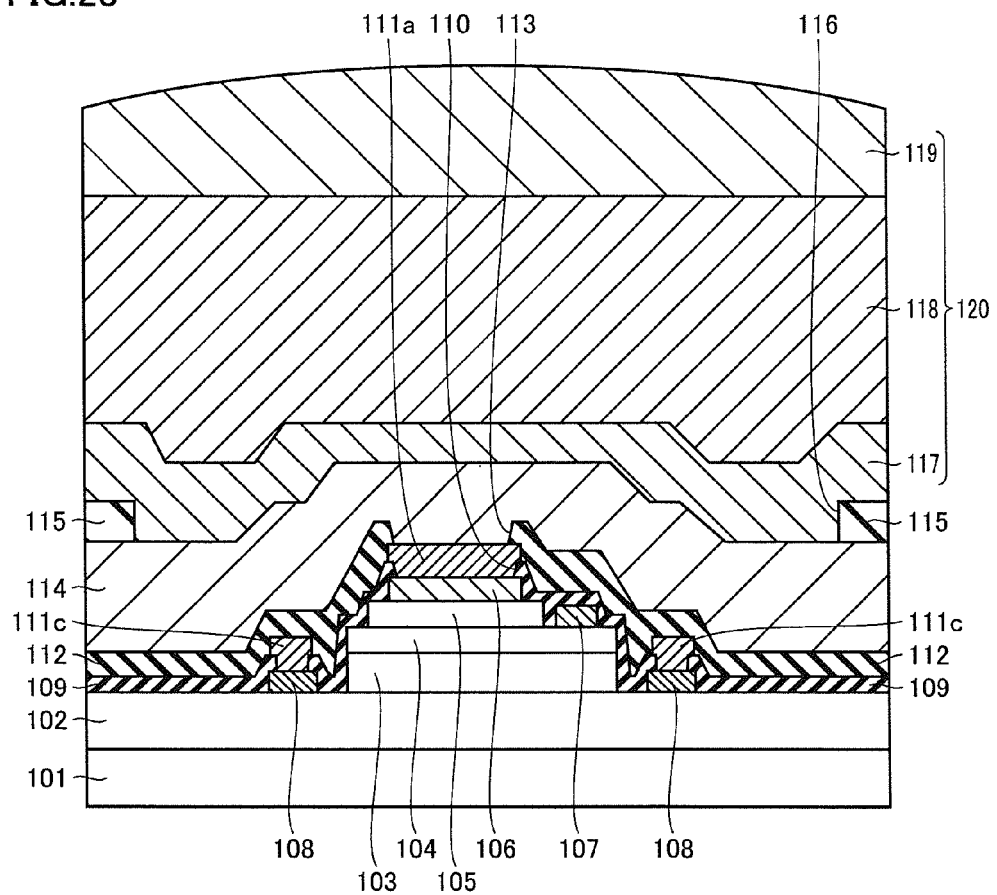
FIG. 28 is a sectional view taken along sectional line XXVIII-XXVIII depicted in FIG. 27.

As illustrated in FIG. 5, first, it is clear that the thermal stress has a substantially constant distribution inside the region of the emitter layer in the case of an overlapping ratio of 100% as in the case of the semiconductor device of the related art illustrated in FIG. 27 etc., which serves as a comparative example. From this state, when the overlapping ratio is decreased by shifting the third opening (pillar bump) in the X direction (positive), it is clear that the thermal stress in the emitter layer tends to gradually decrease from the part of the emitter layer on the side where the third opening is located (part A) toward the part of the emitter layer located on the side opposite the side where the third opening is located (part B).

That is, it is clear that the thermal stress tends to gradually decrease in the emitter layer in the X direction (negative) as the overlapping ratio is made smaller. In addition, it is clear that the thermal stress in part A of the emitter layer also decreases and the thermal stress decreases by around 12% compared with the case of the comparative example when the overlapping ratio is around 7%.

According to an evaluation performed by the inventors, it was determined that, even when the emitter layer and the third opening overlap in plan view, thermal stress at the end portion of the emitter layer can be reduced when the overlapping ratio is lower than ½ (50%) and that the thermal stress can be more effectively reduced when the overlapping ratio is lower than ¼ (25%). That is, it was determined that, in order to reduce thermal stress, it is sufficient that the area over which the emitter layer and the third opening overlap in plan view be small and it is not necessary to adopt a structure in which the emitter layer and the third opening do not overlap at all in plan view.

This is thought to be because thermal stress in the emitter layer 5 etc. can be relieved by forming a region in which the pillar bump 20 is not disposed directly above the emitter layer 5, and, even if the pillar bump 20 is disposed directly above the emitter layer 5, the thermal stress in the emitter layer 5 etc. can be relieved by forming a region in which the emitter layer 5 etc. are covered by the passivation film 15, which is interposed between the pillar bump 20 and the emitter layer 5.

In addition, it is clear that the thermal stress is reduced by around 22% from that in the case of the comparative example when the overlapping ratio is 0%. According to the evaluation performed by the inventors, in the case where the overlapping ratio is 0%, it was determined that stress in the emitter layer can be reduced so long as the end portion of the emitter layer is positioned in a region where the pillar bump and a passivation layer overlap in plan view. That is, it was determined that, in order to reduce thermal stress, it is not necessary to adopt a structure in which the emitter layer and pillar bump do not overlap at all in plan view and that thermal stress can be reduced by interposing the passivation film 15 between the emitter layer 5 and the pillar bump 20.

That is, it is considered that thermal stress in the emitter layer 5 etc. can be relieved by interposing a passivation film in the region in which the emitter layer 5 etc. and the pillar bump 20 overlap in plan view.

Although thermal stress can be reduced by shifting the third opening (pillar bump) away from the emitter layer 5 in the X direction (positive), the thermal resistance when heat generated in the collector layer 3 etc. directly below the emitter layer 5 is conducted to the pillar bump 20 increases due to the distance from the emitter layer 5 etc. to the pillar bump becoming larger. Accordingly, thermal resistance will be examined.

The thermal resistance when heat generated in the collector layer 3 etc. directly below the emitter layer 5 is conducted to the pillar bump 20 becomes markedly larger in an arrangement where the emitter layer and the pillar bump do not overlap in plan view. For example, when the distance between the end portion of the emitter layer in the longitudinal direction and the edge of the third opening is 18 µm, the thermal resistance begins to markedly increase to around 2.6 times that in the related art. In addition, when the distance becomes longer than 18 µm, the thermal resistance rapidly increases in proportion to the increase in distance or greater than in proportion to the increase in distance.

On the other hand, in the case where the overlapping ratio is lower than ½ (50%), the distance from the collector layer 3 etc. directly below the emitter layer 5 to the edge of the third opening 16 of the pillar bump 20 is comparatively short and therefore an increase in the thermal resistance therebetween is avoided. For example, when the overlapping ratio between the emitter layer and the third opening is around 7%, the thermal resistance remains around 1.5 times that in the related art and comparatively gently increases.

In addition, in embodiment 1, the second wiring line 14 is depicted as the wiring line to which the pillar bump 20 is electrically connected and this second wiring line 14 has a film thickness of 4 µm and therefore there is a benefit in that the thermal resistance is partially reduced in this region and the overall thermal resistance is reduced compared with using the 1 µm thick first wiring line 11a as the wiring line to which the pillar bump 20 is electrically connected.

Figure 6:
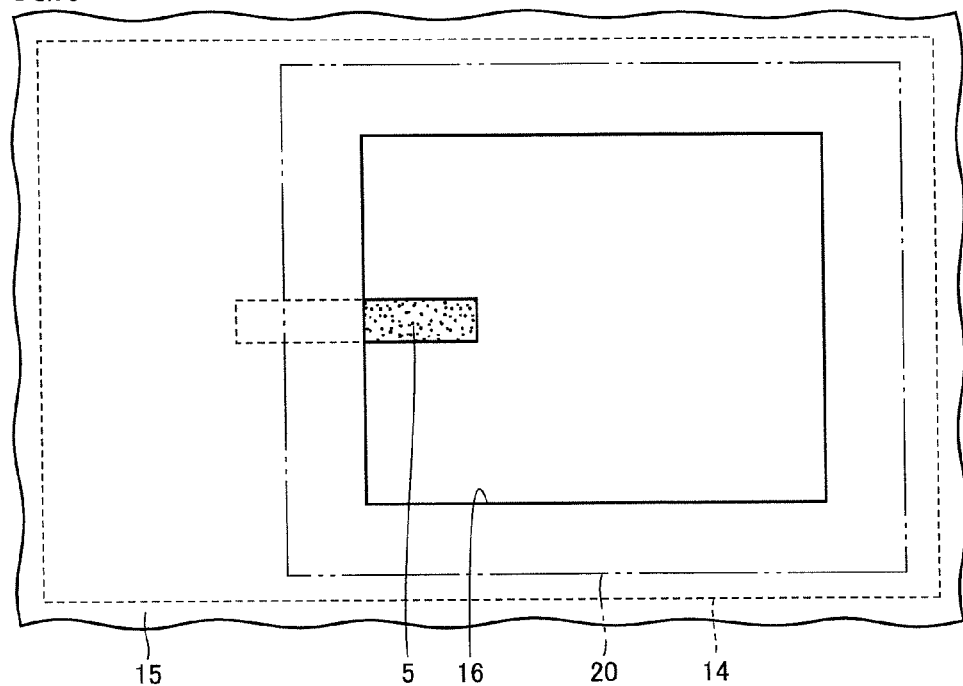
FIG. 6 is a first plan view schematically illustrating the arrangement relationship between an emitter layer and a third opening in the same embodiment.
Figure 7:
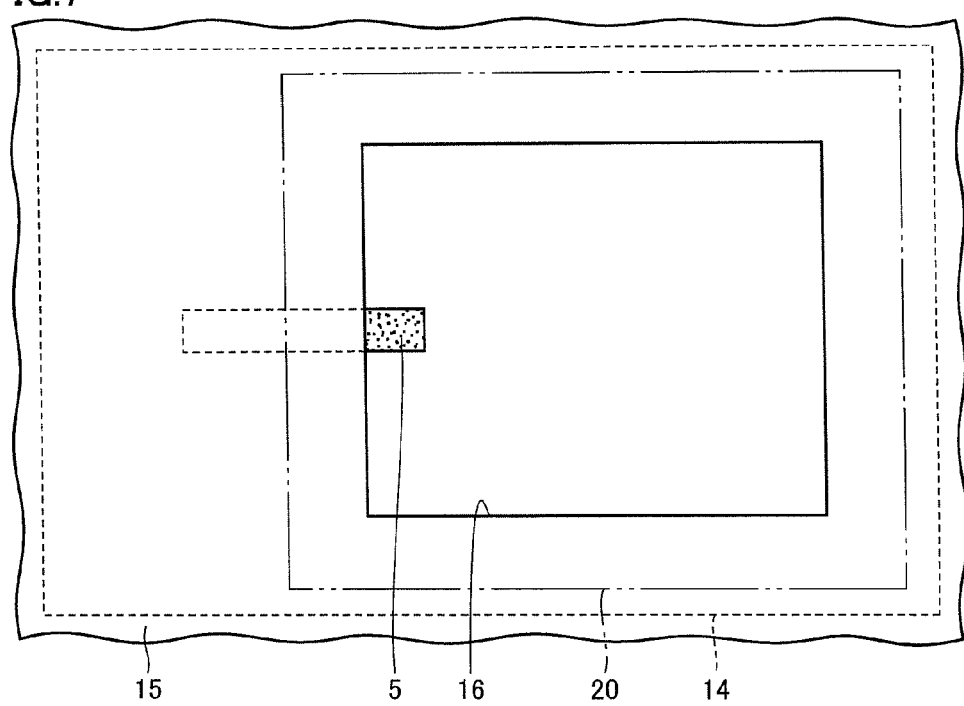
FIG. 7 is a second plan view schematically illustrating the arrangement relationship between the emitter layer and the third opening in the same embodiment.
Figure 8:
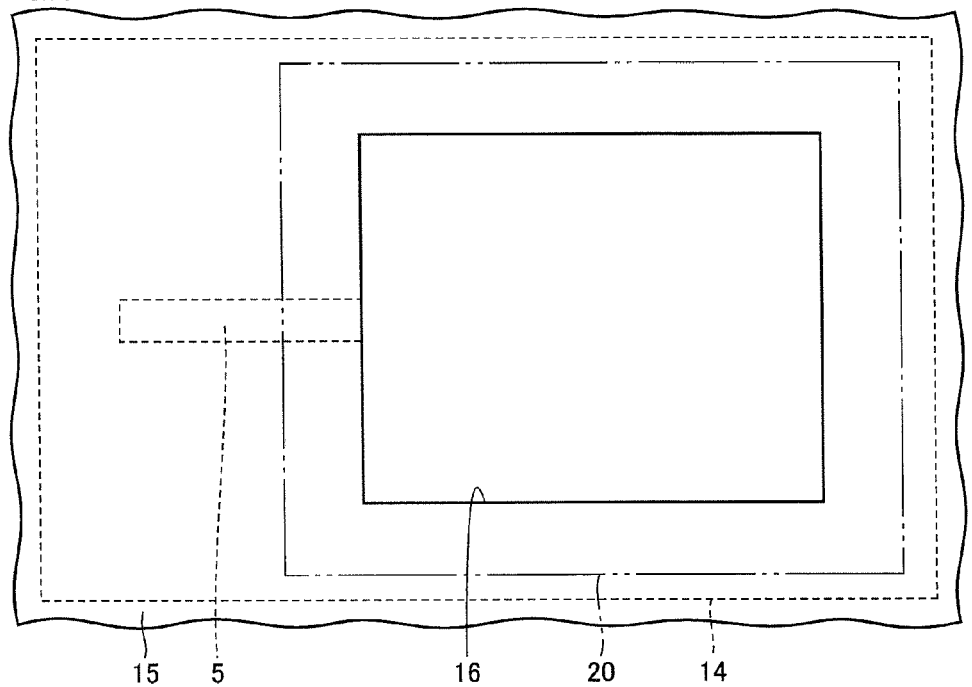
FIG. 8 is a third plan view schematically illustrating the arrangement relationship between the emitter layer and the third opening in the same embodiment.
Figure 9:
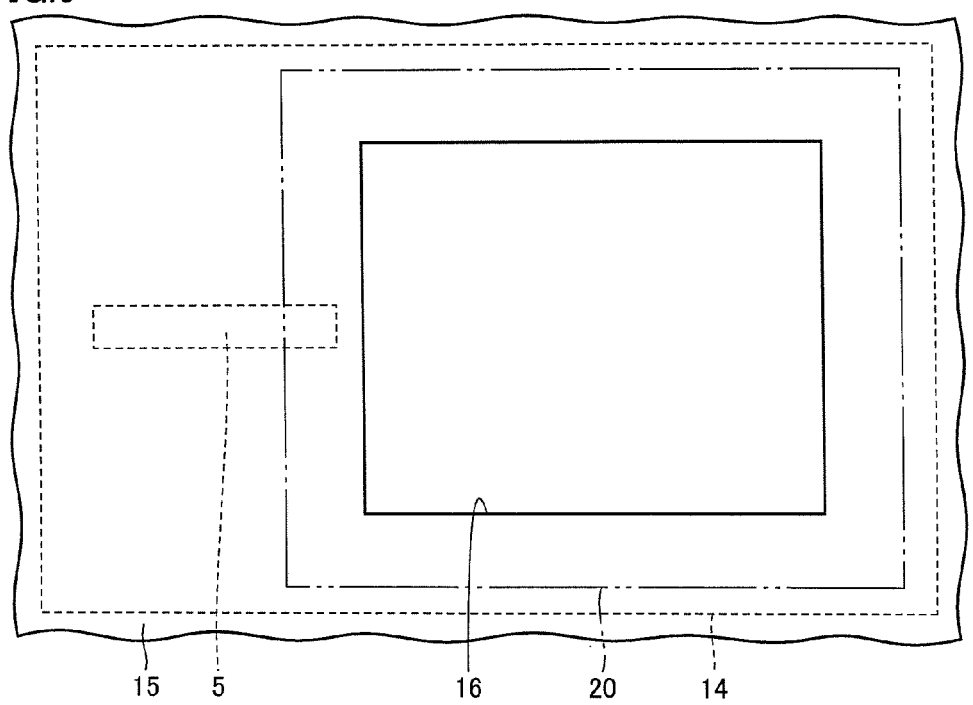
FIG. 9 is a fourth plan view schematically illustrating the arrangement relationship between the emitter layer and the third opening in the same embodiment.

The inventors obtained the following information as a result of investigating the two parameters of thermal stress and thermal resistance. First, an arrangement in which the overlapping ratio between the emitter layer 5 and the third opening 16 is ½ (50%), as illustrated in FIG. 6, is referred to as arrangement A and an arrangement in which the overlapping ratio is ¼ (25%), as illustrated in FIG. 7, is referred to as arrangement B. In addition, an arrangement in which the overlapping ratio is 0 and the end portion of the emitter layer in the longitudinal direction of the emitter layer is aligned with the edge of the opening of the third opening, as illustrated in FIG. 8, is referred to as arrangement C. An arrangement in which the overlapping ratio is 0 and the end portion of the emitter layer 5 in the longitudinal direction of the emitter layer 5 is located in a region in which the pillar bump 20 and the passivation film 15 overlap in plan view, as illustrated in FIG. 9, is referred to as arrangement D.

The inventors found that it is preferable to dispose the third opening 16 with respect to the emitter layer 5 at a position between arrangement A and arrangement D in order to relieve thermal stress while suppressing an increase in thermal resistance and that it is preferable to dispose the third opening 16 with respect to the emitter layer 5 at a position between arrangement B and arrangement D in order to more effectively reduce thermal stress.

Figure 10:
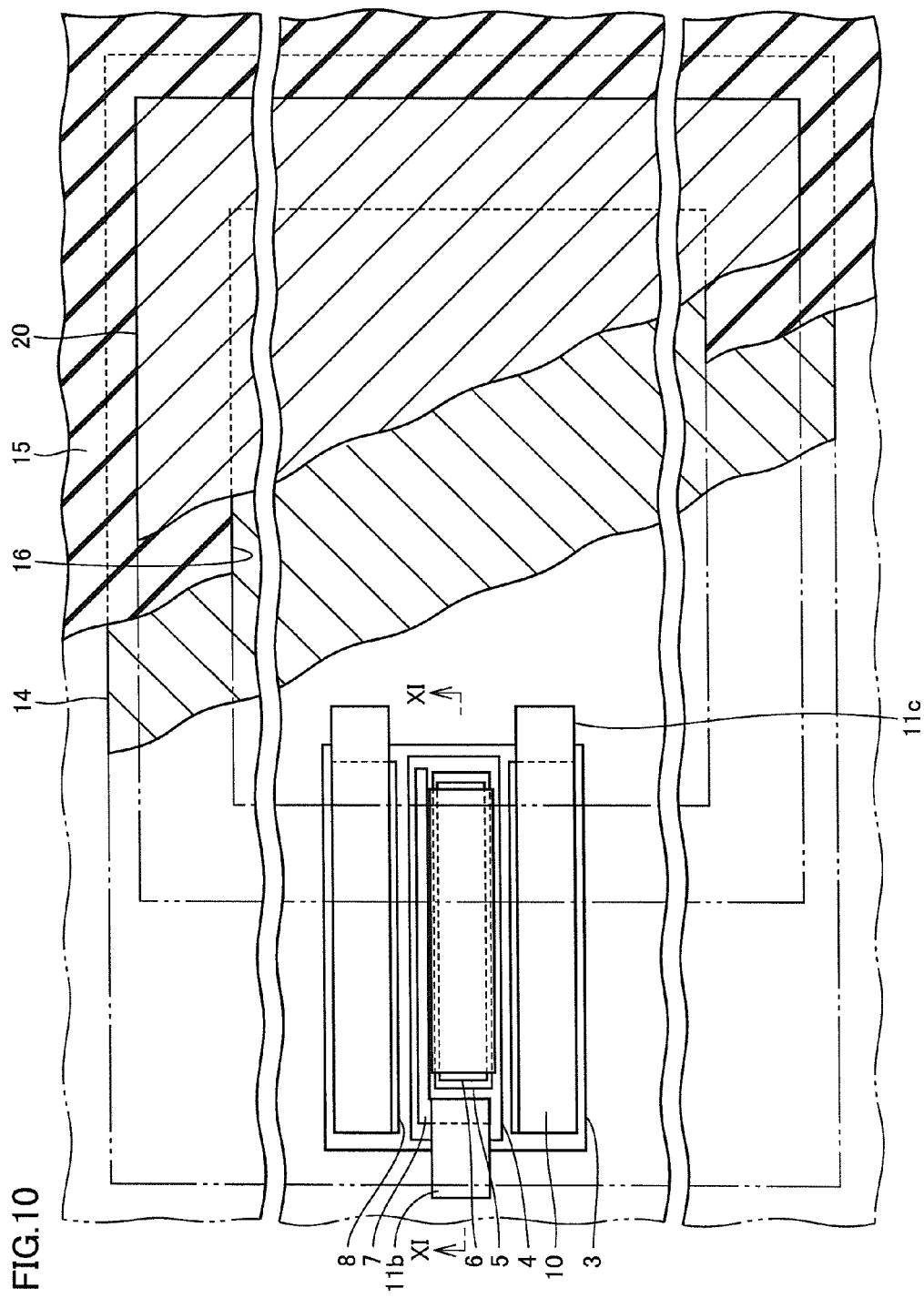
FIG. 10 is a plan view of a semiconductor device according to a modification of the same embodiment.
Figure 11:
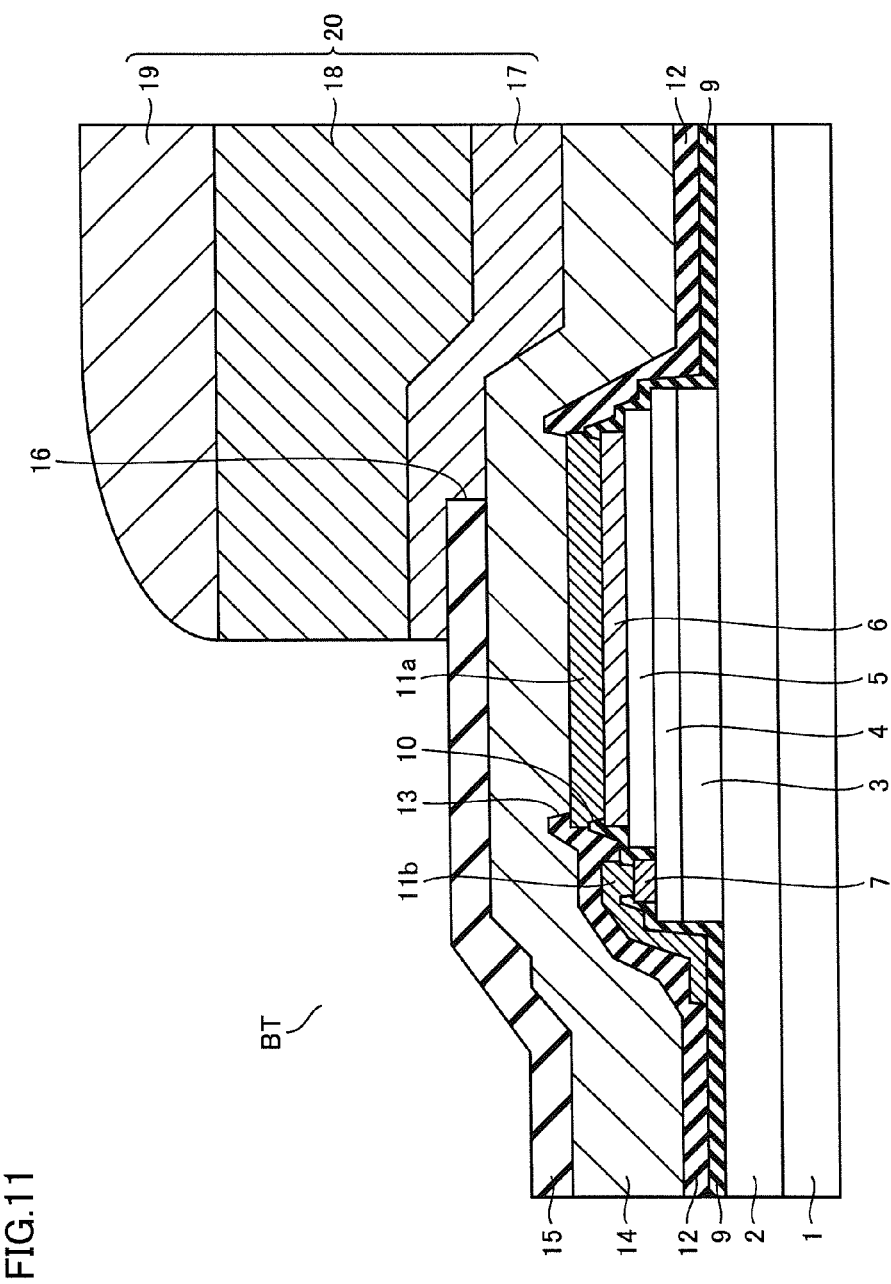
FIG. 11 is a sectional view taken along sectional line XI-XI depicted in FIG. 10 in the same embodiment.

The bipolar transistor illustrated in FIGS. 1 to 4 described above corresponds to arrangement C. In addition, a bipolar transistor having an overlapping ratio of 7% is illustrated in FIGS. 10 and 11. The bipolar transistor illustrated in FIGS. 10 and 11 is the same as the bipolar transistor illustrated in FIGS. 1 to 4 except for the different overlapping ratio and the same parts are denoted by the same symbols and description thereof is not repeated.

In the bipolar transistor described above, by relieving thermal stress in the emitter layer 5 etc., deterioration of the current gain of the bipolar transistor in a short period of time can be prevented when evaluating long-term reliability by applying current to the bipolar transistor at a high temperature, and the reliability of a semiconductor device that includes the bipolar transistor can be improved.

In addition, as a result of the third opening 16 being arranged at a position that is shifted away from a position where the third opening 16 would be directly above the emitter layer 5 in the longitudinal direction of the emitter layer 5, the area occupied by the bipolar transistor is increased compared with the case of the comparative example. In the semiconductor device described above, the increase in the area occupied by the bipolar transistor can be suppressed to the absolute minimum by specifying the area in which to arrange the third opening 16 with respect to the emitter layer 5.

Next, an example of a method of manufacturing the semiconductor device illustrated in FIG. 1 etc. will be described as a method of manufacturing a semiconductor device that includes a bipolar transistor.

First, prescribed layers that will form the sub-collector layer, the collector layer, the base layer, the emitter layer and so forth are formed on the surface of a semi-insulating GaAs substrate by using an epitaxial growth method such as a metal organic chemical vapor deposition (MOCVD) method.

Figure 12:
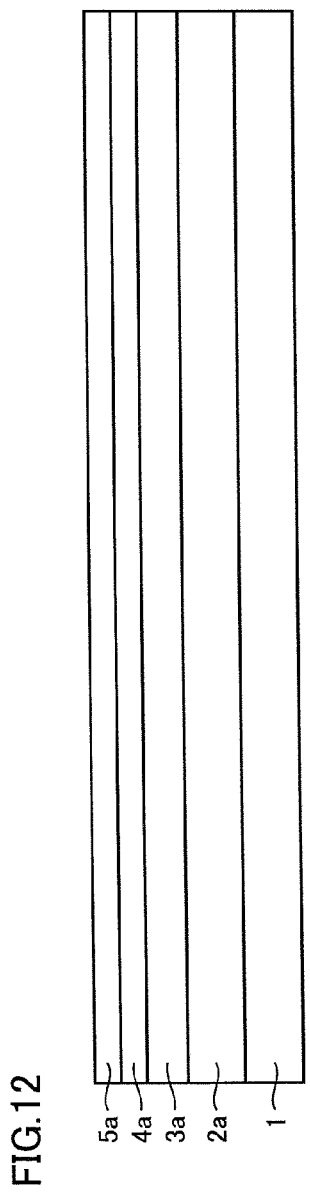
FIG. 12 is a sectional view illustrating a step in a process of manufacturing the semiconductor device in the same embodiment.

As illustrated in FIG. 12, an n-type GaAs layer 2a (Si concentration $5 \times 10^{18}$ cm$^{-3}$, film thickness: 0.6 µm), which will become the sub-collector layer, is formed on the semi-insulating GaAs substrate 1. An n-type GaAs layer 3a (Si concentration: $5 \times 10^{16}$ cm$^{-3}$, film thickness: 1.0 µm), which will become the collector layer, is formed so as to contact the n-type GaAs layer 2a. A p-type GaAs layer 4a (C concentration: $4 \times 10^{19}$ cm$^{-3}$, film thickness: 50 nm), which will become the base layer, is formed so as to contact the n-type GaAs layer 3a.

Next, an epitaxial layer 5a, which will become the emitter layer, is formed so as to contact the p-type GaAs layer 4a. The epitaxial layer 5a is obtained by stacking in order an n-type $In_xGa_{1-x}P$ layer (In composition ratio x=0.5, Si concentration $3 \times 10^{17}$ cm$^{-3}$, film thickness: 30 nm), an n-type GaAs layer (Si concentration: $3 \times 10^{17}$ cm$^{-3}$, film thickness: 90 nm), an n-type GaAs contact layer (Si concentration $1 \times 10^{19}$ cm$^{-3}$, film thickness: 50 nm) and an n-type $In_xGa_{1-x}As$ contact layer (In composition ratio x=0.5, Si concentration:$1 \times 10^{19}$ cm$^{-3}$, film thickness: 50 nm).

Figure 13:
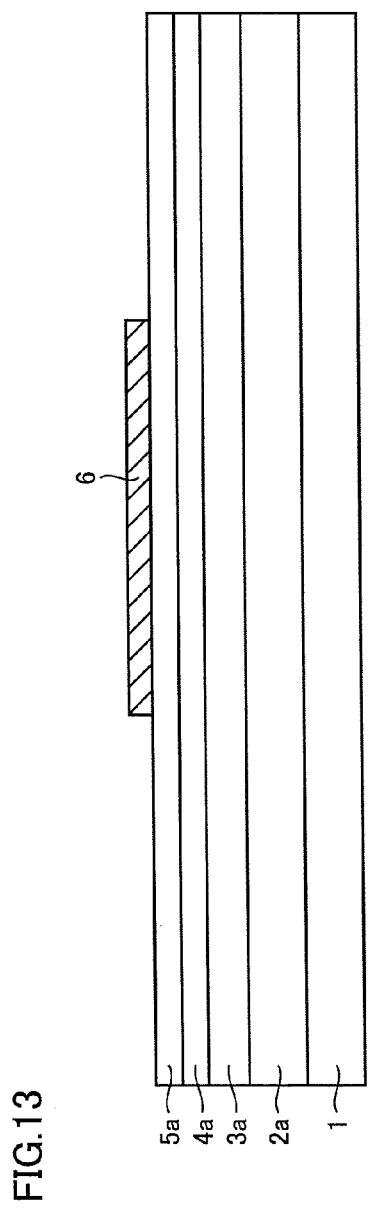
FIG. 13 is a sectional view illustrating a step performed after the step illustrated in FIG. 12 in the same embodiment.

Next, a tungsten silicide (WSi) film (Si molar ratio: 0.3, film thickness: 0.3 µm) is deposited over the entire surface of the epitaxial layer 5a by using a high-frequency sputtering method. After that, the emitter electrode 6 is formed as illustrated in FIG. 13 by performing prescribed photolithography processing and dry etching processing using a prescribed gas.

Figure 14:
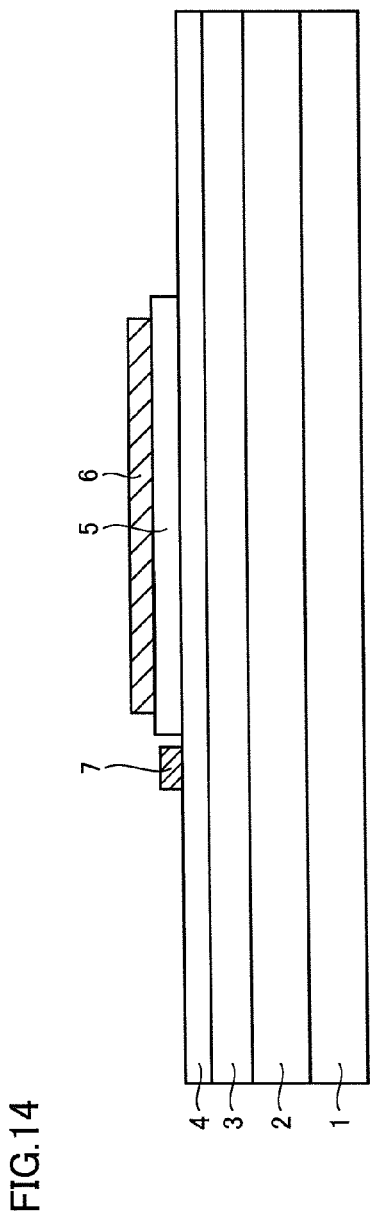
FIG. 14 is a sectional view illustrating a step performed after the step illustrated in FIG. 13 in the same embodiment.
Figure 15:
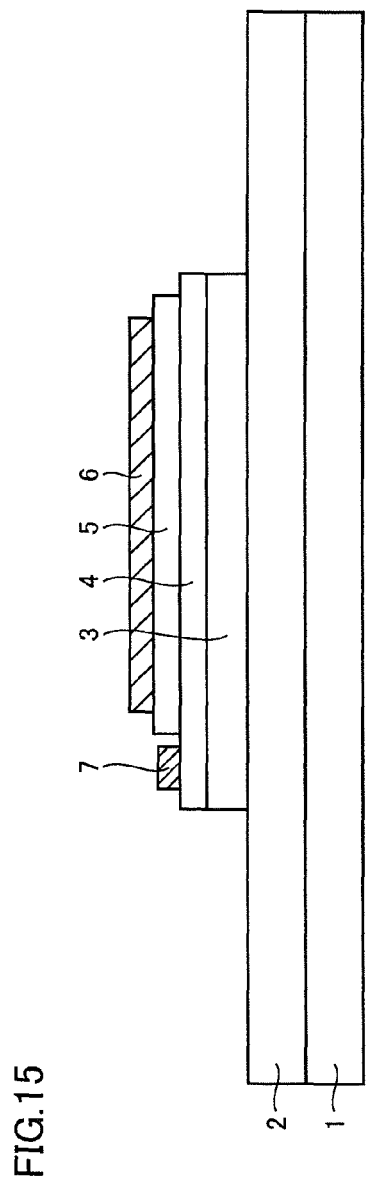
FIG. 15 is a sectional view illustrating a step performed after the step illustrated in FIG. 14 in the same embodiment.

Next, the emitter layer 5 is patterned into a desired shape, as illustrated in FIG. 14, by performing prescribed photolithography processing and wet etching processing using a prescribed chemical. Next, the base electrode 7 is formed so as to contact the p-type GaAs layer 4a. After that, the base layer 4 and the collector layer 3 are formed, as illustrated in FIG. 15, by performing prescribed photolithography processing and wet etching processing using a prescribed chemical.

Next, the collector electrode 8 (refer to FIG. 2) is formed so as to contact the sub-collector layer 2. Then, the sub-collector layer 2 is patterned into a desired shape by performing prescribed photolithography processing and wet etching processing using a prescribed chemical.

Figure 16:
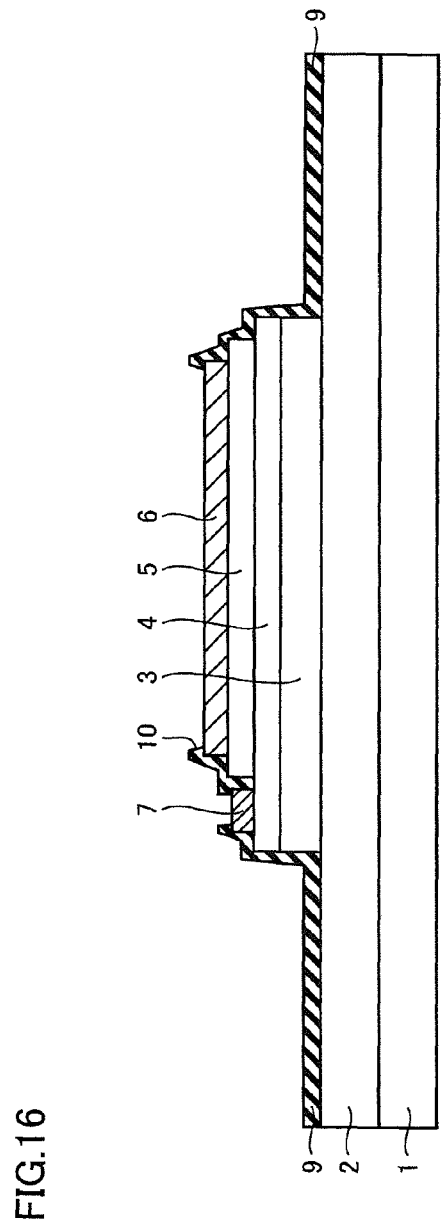
FIG. 16 is a sectional view illustrating a step performed after the step illustrated in FIG. 15 in the same embodiment.

After that, the first insulating film 9 (refer to FIG. 16), which is composed of a silicon nitride film for example, is formed so as to cover the emitter electrode 6 etc. Next, the first opening 10, through which the emitter electrode 6 is exposed, and an opening, through which the base electrode 7 is exposed, are formed in the first insulating film 9, as illustrated in FIG. 16, by performing prescribed photolithography processing and prescribed dry etching processing.

Figure 17:
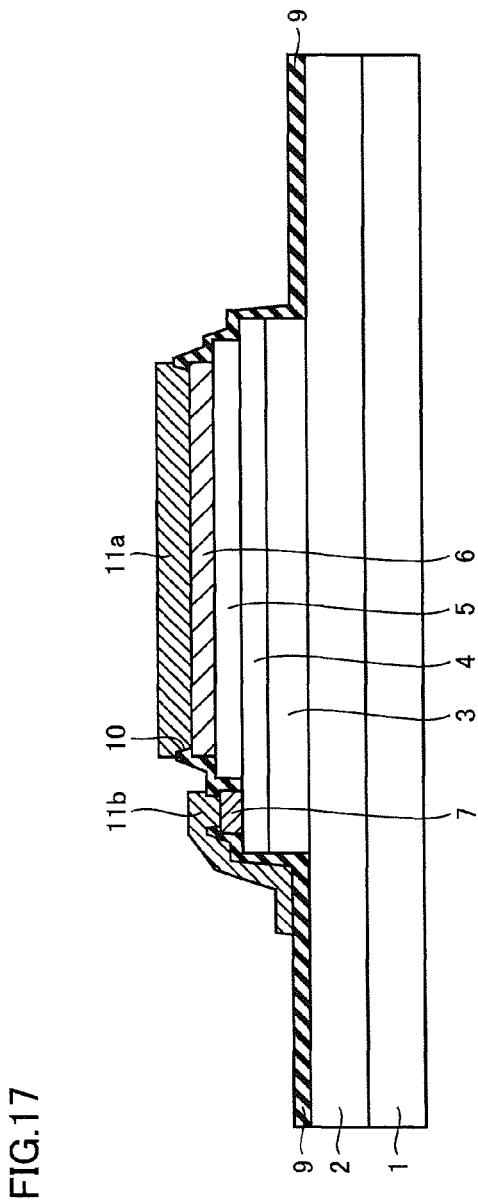
FIG. 17 is a sectional view illustrating a step performed after the step illustrated in FIG. 16 in the same embodiment.

After that, a metal film (not illustrated), which will become the first wiring lines, is formed so as to bury the first opening 10 and so forth. Next, the first wiring line 11a that is electrically connected to the emitter electrode 6, the first wiring line 11b that is electrically connected to the base electrode 7, and so forth are formed, as illustrated in FIG. 17, by performing prescribed photolithography processing and prescribed etching processing.

Figure 18:
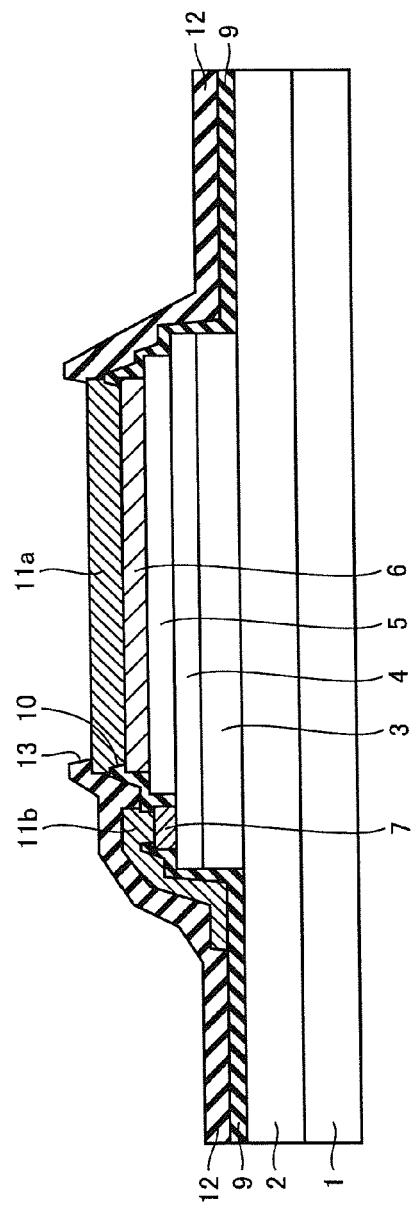
FIG. 18 is a sectional view illustrating a step performed after the step illustrated in FIG. 17 in the same embodiment.

After that, the second insulating film 12 (refer to FIG. 18), which is composed of a silicon nitride film for example, is formed so as to cover the first wiring lines 11a, 11b etc. Next, the second opening 13, through which the first wiring line 11a is exposed, is formed in the second insulating film 12, as illustrated in FIG. 18, by performing prescribed photolithography processing and prescribed dry etching processing.

Figure 19:
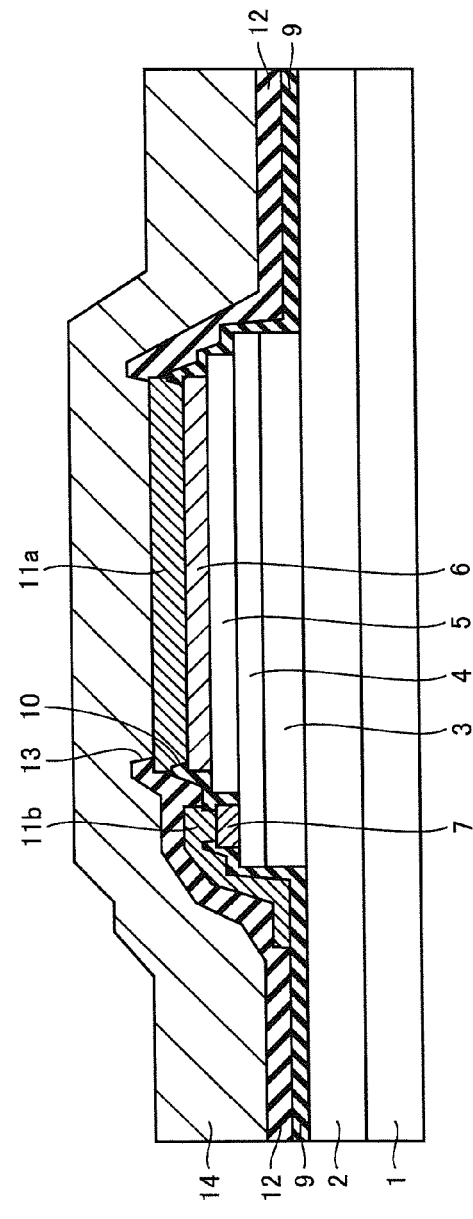
FIG. 19 is a sectional view illustrating a step performed after the step illustrated in FIG. 18 in the same embodiment.

After that, a metal film (not illustrated), which will become the second wiring line, is formed so as to bury the second opening 13. Next, the second wiring line 14 that is electrically connected to the first wiring line 11a is formed, as illustrated in FIG. 19, by performing prescribed photolithography processing and prescribed etching processing. The second wiring line 14 is formed so as to cover the entirety of the bipolar transistor including the emitter layer, as illustrated in FIG. 1.

Figure 20:
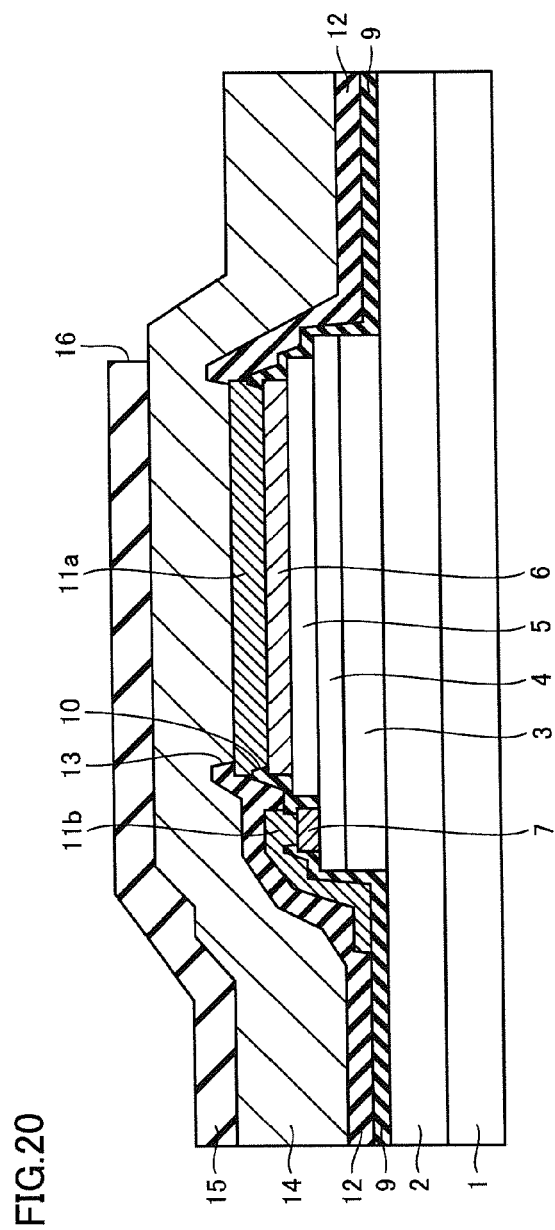
FIG. 20 is a sectional view illustrating a step performed after the step illustrated in FIG. 19 in the same embodiment.

Next, a passivation film (not illustrated), which is composed of a silicon nitride film for example, is formed so as to cover the second wiring line 14. After that, the third opening 16, through which the second wiring line 14 is exposed, is formed as illustrated in FIG. 20 by performing prescribed lithography processing and prescribed etching processing. In addition, as illustrated in FIGS. 20 and 1, the third opening 16 is formed with respect to the emitter layer 5 such that an end portion of the emitter layer 5 in the longitudinal direction of the emitter layer 5 and the edge of the opening of the third opening 16 are substantially aligned with each other.

Figure 21:
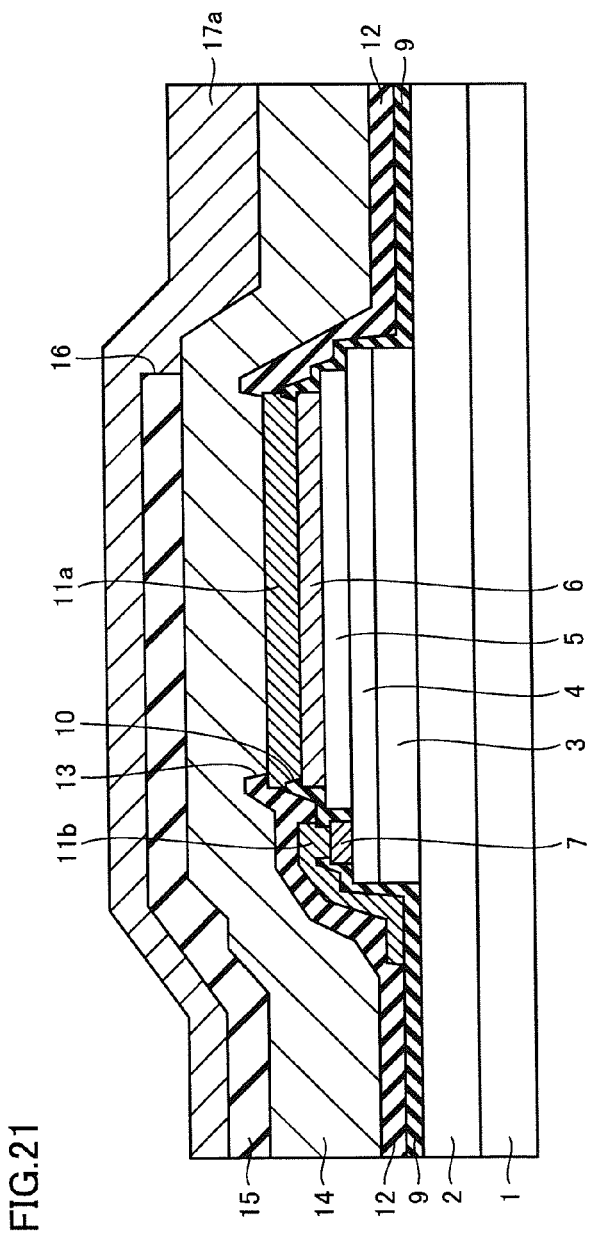
FIG. 21 is a sectional view illustrating a step performed after the step illustrated in FIG. 20 in the same embodiment.
Figure 22:
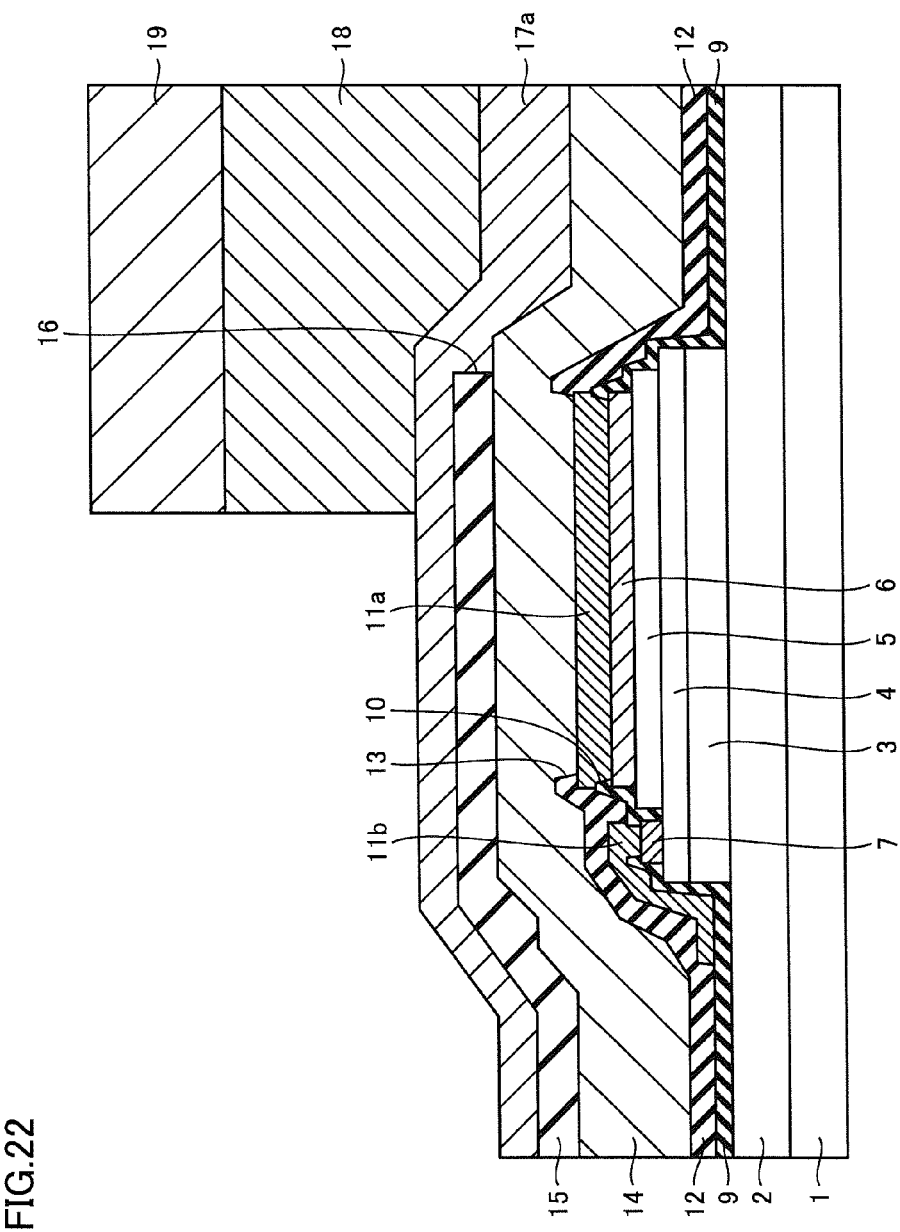
FIG. 22 is a sectional view illustrating a step performed after the step illustrated in FIG. 21 in the same embodiment.
Figure 23:
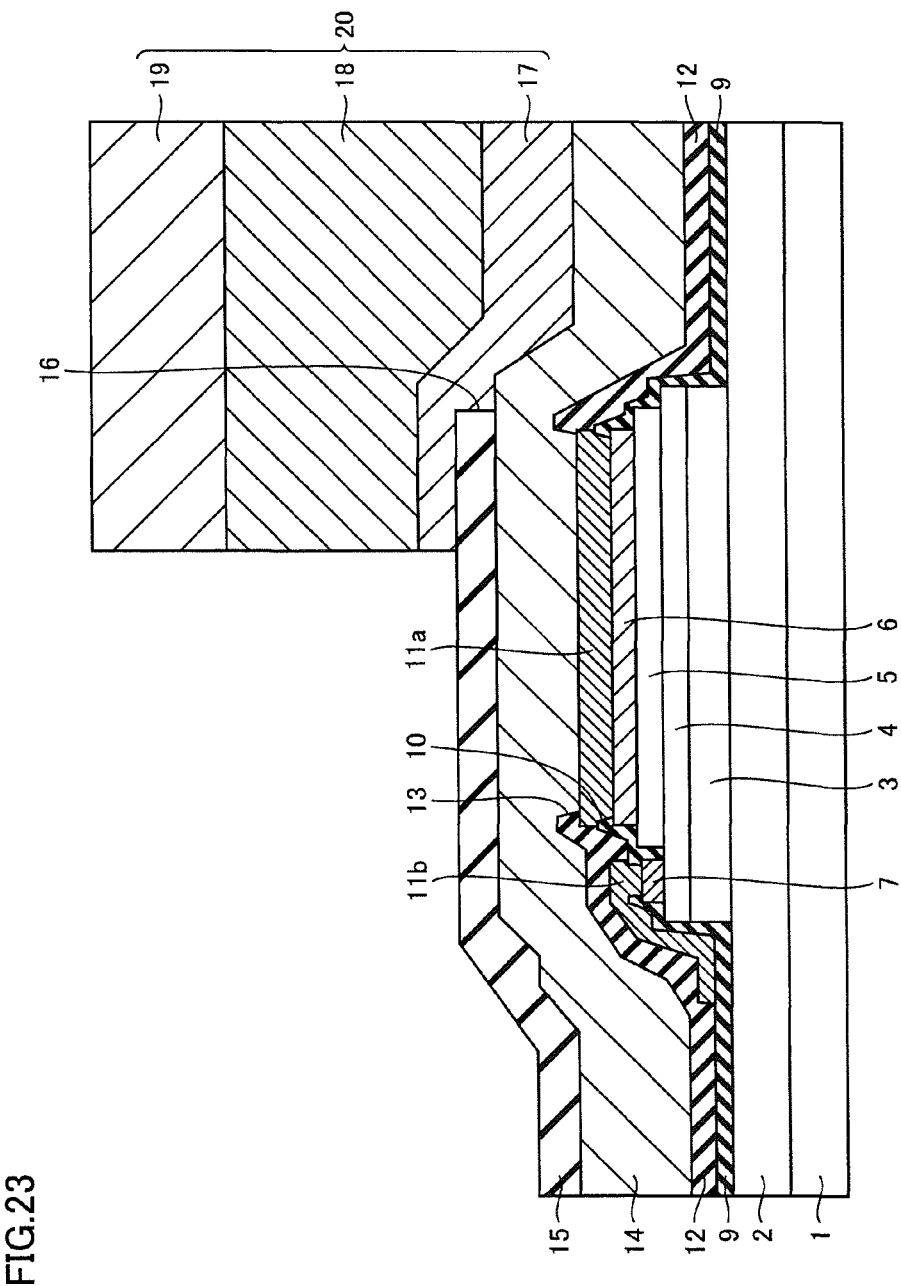
FIG. 23 is a sectional view illustrating a step performed after the step illustrated in FIG. 22 in the same embodiment.

Next, as illustrated in FIG. 21, a titanium (Ti) film 17a, which will become the UBM, is formed. After that, as illustrated in FIG. 22, the metal post 18, which is composed of a copper (Cu) film and the solder 19 are stacked in a prescribed region so as to contact the titanium film 17a. Next, the pillar bump 20, which has a multilayer structure consisting of the UBM 17, the metal post 18 and the solder 19, is formed as illustrated in FIG. 23 by removing the exposed titanium film 17a. As illustrated in FIG. 1, the pillar bump 20 is formed so as to bury the third opening 16 and so as to cover the passivation film 15 along the edge of the opening of the third opening 16. Thus, the principal part of the semiconductor device including the bipolar transistor BT is formed.

In the method of manufacturing a semiconductor device described above, the overlapping ratio, which represents overlapping of the emitter layer 5 and the third opening 16 in plan view, is 0 and the end portion of the emitter layer 5 in the longitudinal direction of the emitter layer 5 is arranged so as to be substantially aligned with the edge of the opening of the third opening 16 (arrangement C). Thus, as has been described above, thermal stress can be effectively relieved while suppressing an increase in thermal resistance and the reliability of a semiconductor device that includes a bipolar transistor can be improved. In addition, the area occupied by the bipolar transistor can be reduced to the absolute minimum.

Embodiment 2

Next, a semiconductor device in which a rewiring line is formed will be described as a second example of a semiconductor device that includes a heterojunction bipolar transistor.

Figure 24:
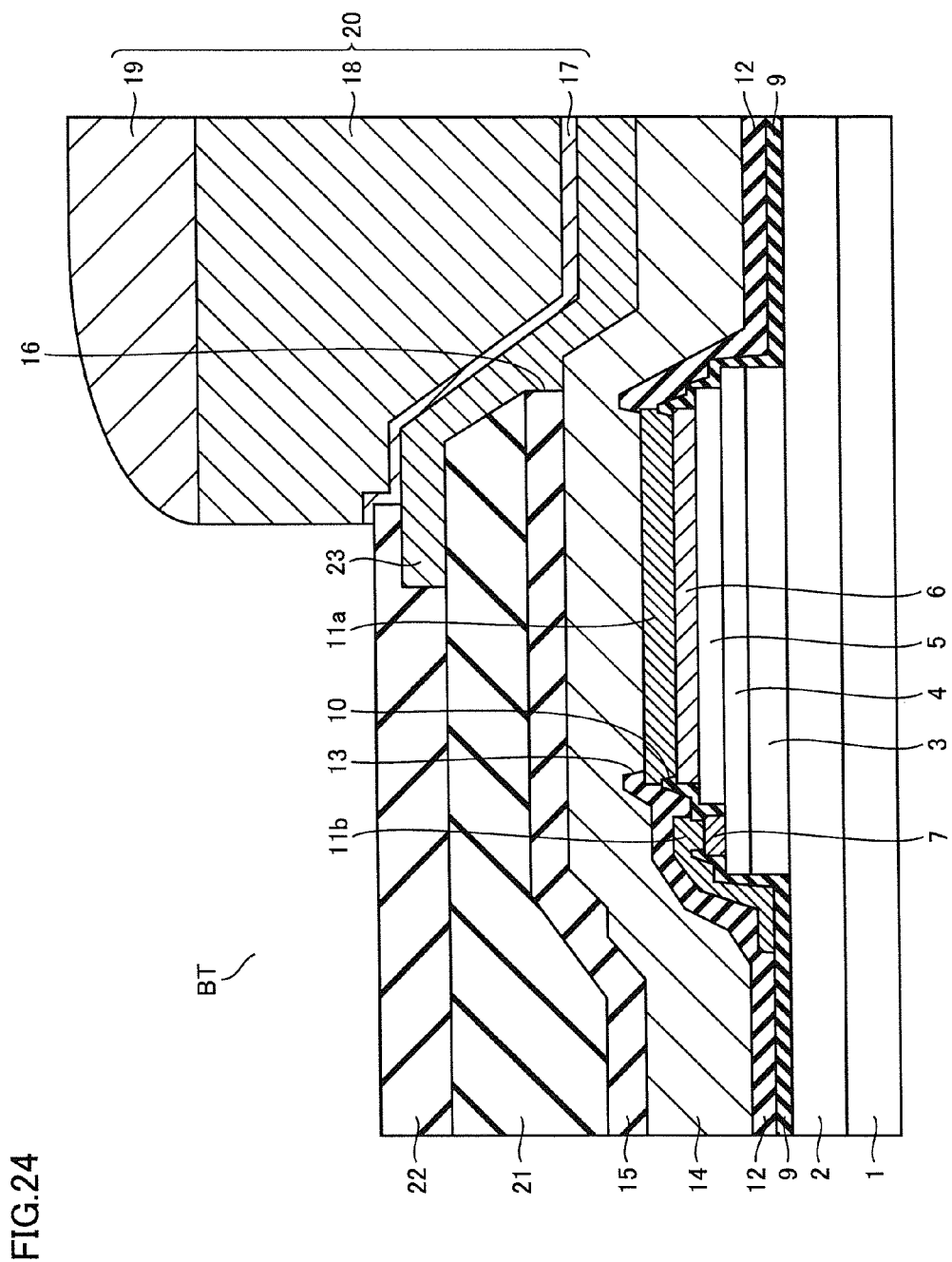
FIG. 24 is a sectional view of a semiconductor device according to embodiment 2 of the present disclosure.

As illustrated in FIG. 24, a third insulating film 21 (film thickness: 10 µm) composed of a polyimide film or the like is formed so as to cover the passivation film 15. The third opening 16, through which the second wiring line 14 is exposed, is formed in the third insulating film 21 and the passivation film 15. The third opening 16 is arranged with respect to the emitter layer 5 such that the end portion of the emitter layer 5 in the longitudinal direction of the emitter layer 5 and the edge of the opening of the third opening 16 are substantially aligned with each other (arrangement C).

A third wiring line 23 (film thickness: 5 µm), which serves as a rewiring line and is composed of a copper (Cu) film, is formed so as to contact the second wiring line 14 exposed at the bottom of the third opening 16 and so as to contact the part of the third insulating film 21 located along the edge of the opening of the third opening 16. In addition, a fourth insulating film 22 (film thickness: 3 µm) is formed that contacts the third insulating film 21, through which the third wiring line 23 is exposed and that is composed of a polyimide film. The pillar bump 20 is formed so as to contact the third wiring line 23 and so as to contact the fourth insulating film 22.

The rest of the configuration is the same as that of the semiconductor device described in embodiment 1 and illustrated in FIGS. 1 to 4, and therefore parts that are the same are denoted by the same symbols and, unless necessary, description thereof is not repeated.

In the semiconductor device described above, the overlapping ratio between the emitter layer 5 and the third opening 16 is 0 and the end portion of the emitter layer 5 in the longitudinal direction of the emitter layer 5 is arranged so as to be aligned with the edge of the opening of the third opening 16 (arrangement C). Thus, thermal stress can be effectively relieved while suppressing an increase in thermal resistance as described in embodiment 1.

Furthermore, in addition to the passivation film 15, the third insulating film 21 and the fourth insulating film 22 are also interposed between second wiring line 14 and the pillar bump 20 in the bipolar transistor in which the third wiring line is formed as a rewiring line. Thus, thermal stress can be more effectively relieved and degradation of the lifetime (current gain) can be avoided when evaluating the long-term reliability by applying current at a high-temperature.

In addition, forming the second wiring line 14 so as to cover the entirety of the emitter layer 5 can also contribute to reducing the thermal resistance.

Furthermore, by forming the third wiring line 23 after forming the passivation film 15, the degree of freedom in arranging, for example, a pad electrically connected to the third wiring line 23 can be increased. That is, a bump can be disposed on another element such as a resistance or capacitance element and therefore the chip size can be made smaller. In addition, if the film thickness of the rewiring line is made sufficiently large, it is possible to form a low-loss spiral inductor having a high Q value and the performance of a monolithic microwave integrated circuit (MMIC) can be improved.

Furthermore, in the semiconductor device described above, as an example, arrangement C was described in which the end portion of the emitter layer 5 in the longitudinal direction of the emitter layer 5 is arranged as to be aligned with the edge of the opening of the third opening 16. The arrangement relationship between the emitter layer 5 and the third opening 16 is not limited to arrangement C and it is sufficient that the third opening 16 be arranged at a position between arrangement A and arrangement D with respect to the emitter layer 5 in order to relieve thermal stress while suppressing an increase in the thermal resistance and it is sufficient that the third opening be arranged at a position between arrangement B and arrangement D with respect to the emitter layer 5 in order to more effectively reduce thermal stress.

Embodiment 3

Next, a modification of embodiment 2 will be described as a third example of a semiconductor device that includes a heterojunction bipolar transistor.

Figure 25:
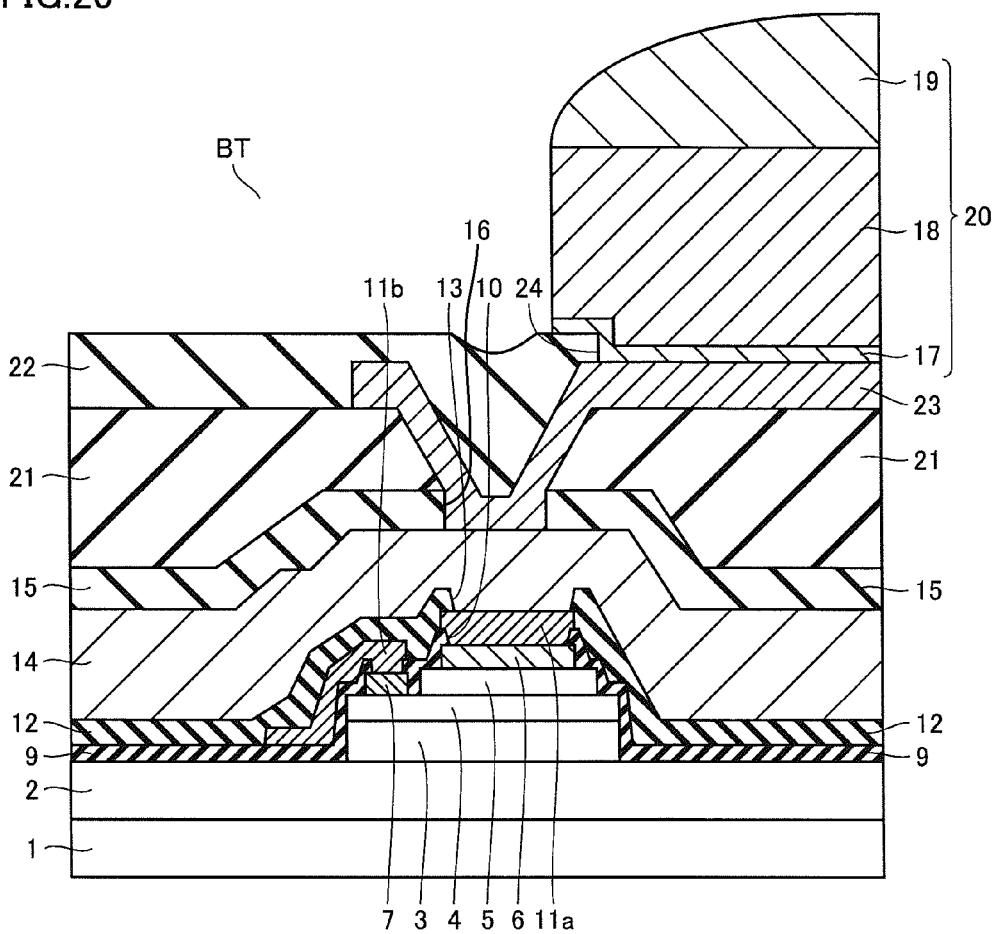
FIG. 25 is a sectional view of a semiconductor device according to embodiment 3 of the present disclosure.

As illustrated in FIG. 25, the third insulating film 21 (film thickness: 10 µm) composed of a polyimide film or the like is formed so as to cover the passivation film 15. The third opening 16, through which the second wiring line 14 (film thickness: 5 µm) composed of a copper (Cu) film is exposed, is formed in the third insulating film 21 and the passivation film 15.

The third wiring line 23, which serves as a rewiring line, is formed so as to contact the second wiring line 14 exposed at the bottom of the third opening 16 and so as to contact the part of the third insulating film 21 located along the edge of the opening of the third opening 16. The third wiring line 23 is electrically connected to the emitter layer 5 over a short distance via a part of the second wiring line 14 and a part of the first wiring line 11a that are located directly above the emitter layer 5, and via the emitter electrode 6.

Furthermore, the fourth insulating film 22 (film thickness: 3 µm), which is composed of a polyimide film for example, is formed so as to contact the third insulating film 21. A fourth opening 24, through which the third wiring line 23 is exposed, is formed in the fourth insulating film 22. The pillar bump 20 is formed so as to contact the third wiring line and so as to contact the fourth insulating film 22. The fourth opening 24 is arranged with respect to the emitter layer such that the end portion of the emitter layer 5 in the longitudinal direction of the emitter layer 5 and the edge of the opening of the fourth opening 24 are substantially aligned with each other.

The rest of the configuration is the same as that of the semiconductor device described in embodiment 1 and illustrated in FIGS. 1 to 4, and therefore parts that are the same are denoted by the same symbols and, unless necessary, description thereof is not repeated.

In the semiconductor device described above, the overlapping ratio between the emitter layer 5 and the fourth opening 24 is 0 and the end portion of the emitter layer 5 in the longitudinal direction of the emitter layer 5 is arranged so as to be aligned with the edge of the opening of the fourth opening 24 (arrangement C). Thus, thermal stress can be effectively relieved while suppressing an increase in thermal resistance as described in embodiment 1.

Furthermore, in addition to the passivation film 15, the third insulating film 21 and the fourth insulating film 22 are also interposed between second wiring line 14 and the pillar bump 20 in the bipolar transistor in which the third wiring line is formed as a rewiring line. Thus, thermal stress can be more effectively relieved and degradation of the lifetime (current gain) can be avoided when evaluating the long-term reliability by applying current at a high-temperature.

In addition, compared to the case of embodiment 2, the third insulating film 21 having a film thickness of 10 µm is newly interposed between the plane where the pillar bump 20 contacts the third wiring line 23, and the emitter layer 5. Thus, the thermal stress can be more effectively relieved compared with the case of embodiment 2.

In addition, forming the second wiring line 14 so as to cover the entirety of the emitter layer 5 can also contribute to reducing the thermal resistance.

Furthermore, by forming the third wiring line 23 after forming the passivation film 15, the degree of freedom in arranging, for example, a pad electrically connected to the third wiring line 23 can be increased, and, in particular, the chip size can be reduced since a pad can be disposed on a resistance or capacitance element. In addition, an inductor having a high Q value can be formed by making the thickness of the rewiring layer large.

Furthermore, in the semiconductor device described above, as an example, arrangement C was described in which the end portion of the emitter layer 5 in the longitudinal direction of the emitter layer 5 is arranged to as to be aligned with the edge of the opening of the fourth opening 24. The arrangement relationship between the emitter layer 5 and the fourth opening 24 is not limited to arrangement C and it is sufficient that the fourth opening 24 be arranged at a position between arrangement A and arrangement D with respect to the emitter layer 5 in order to relieve thermal stress while suppressing an increase in the thermal resistance and it is sufficient that the fourth opening be arranged at a position between arrangement B and arrangement D with respect to the emitter layer 5 in order to more effectively reduce thermal stress.

Embodiment 4

Next, a semiconductor device, in which a substrate on which a bipolar transistor has been formed, is mounted on a mounting substrate will be described.

Figure 26:
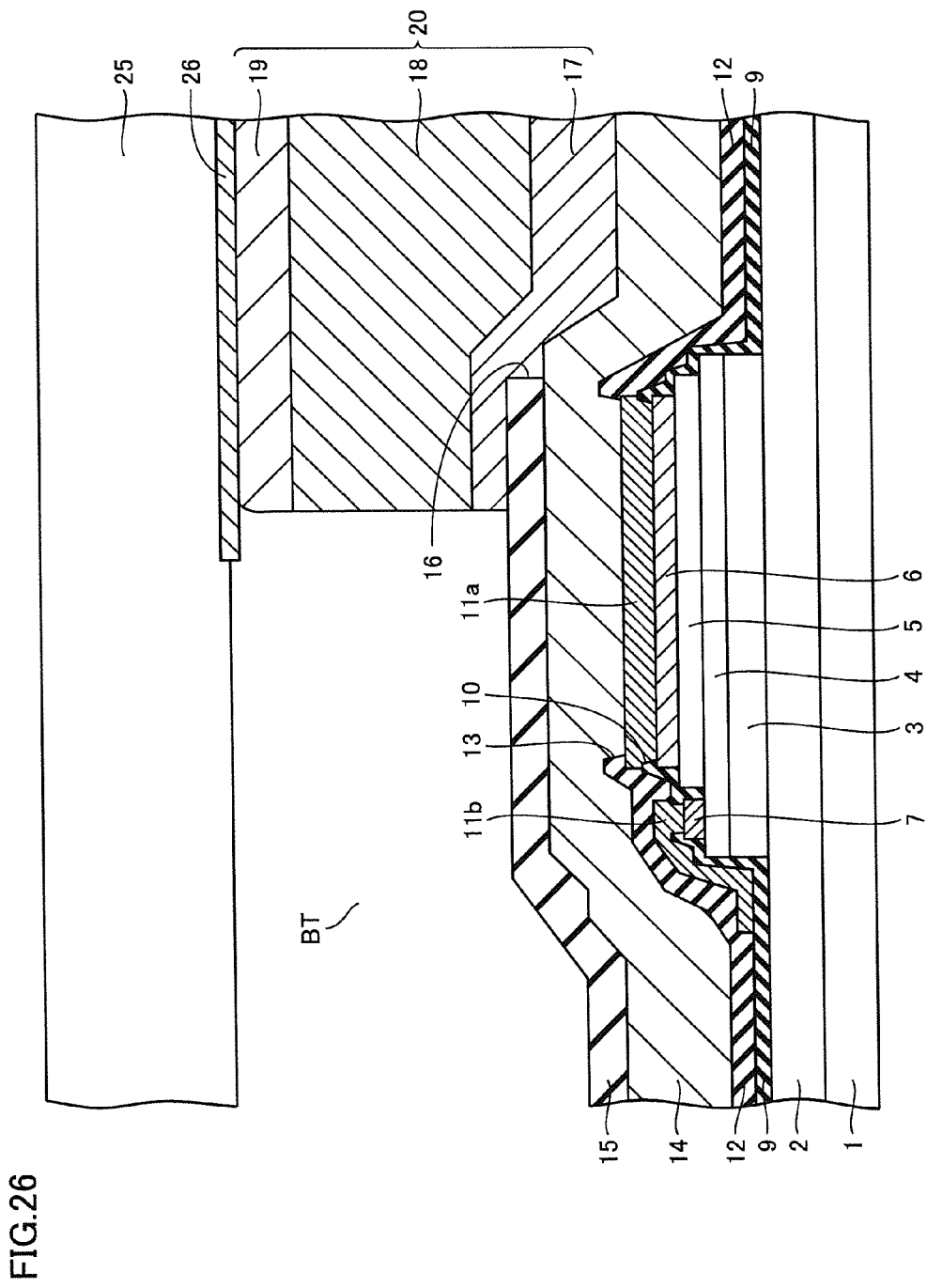
FIG. 26 is a sectional view of a semiconductor device according to embodiment 4 of the present disclosure.

As illustrated in FIG. 26, the pillar bump 20, which is electrically connected to the emitter layer 5, is connected to a mounting substrate 25. For example, an alumina substrate, a ceramic substrate or a PCB can be used as the mounting substrate 25. A thin-film metal wiring line 26, to which the pillar bump is connected, is arranged on a surface of the mounting substrate 25. The bipolar transistor including the emitter layer is the same as the bipolar transistor illustrated in FIG. 1 etc.

In the semiconductor device in which the bipolar transistor is mounted on the mounting substrate 25, it is assumed that thermal stress caused by a difference between the rate of thermal expansion of the emitter layer 5 etc. and the rate of thermal expansion of the mounting substrate 25 is generated in the emitter layer 5 etc. via the pillar bump 20.

In the semiconductor device including the mounting substrate described above, the overlapping ratio between the emitter layer 5 and the third opening 16 is 0 and the end portion of the emitter layer 5 in the longitudinal direction of the emitter layer 5 is arranged so as to be aligned with the edge of the opening of the third opening 16 (arrangement C). Thus, thermal stress caused by a difference between the rate of thermal expansion of the emitter layer 5 etc. and the rate of thermal expansion of the mounting substrate 25 can be effectively relieved while suppressing an increase in thermal resistance as described in embodiment 1.

In the semiconductor device described above, although, as an example, arrangement C was described in which the end portion of the emitter layer 5 in the longitudinal direction is arranged as to be aligned with the edge of the opening of the third opening 16, it is sufficient that the third opening 16 be arranged at a position between arrangement A and arrangement D with respect to the emitter layer 5 in order to relieve thermal stress while suppressing an increase in the thermal resistance and it is sufficient that the third opening 16 be arranged at a position between arrangement B and arrangement D with respect to the emitter layer 5 in order to more effectively reduce thermal stress.

Furthermore, in the above-described embodiments, although a semiconductor device that includes a single bipolar transistor was described as an example, the present disclosure may also be applied to a semiconductor device in which a plurality of bipolar transistors are formed on a semi-insulating GaAs substrate. In addition, although a pillar bump was described as an example of a bump, other than a pillar bump, for example, a solder bump or a stud bump may be used.

Furthermore, in the bipolar transistors of the embodiments described above, a case in which the emitter layer 5 is formed of an InGaP layer and the base layer 4 is formed of a GaAs layer was described as an example. The combination of materials for the emitter layer and the base layer (emitter layer/base layer) is not limited to InGaP layer/GaAs layer, and, for example, the present disclosure may be also applied to heterojunction bipolar transistors that use materials such as AlGaAs layer/GaAs layer, InP layer/InGaAs layer, InGaP layer/GaAsSb layer, InGaP layer/InGaAsN layer, Si layer/SiGe layer and AlGaN layer/GaN layer.

In addition, in the embodiments described above, a case in which the planar shape of the emitter layer 5 is rectangular was described as an example, but the planar shape of the emitter layer may instead be circular, elliptical, hexagonal or octagonal, for example. Furthermore, in the embodiments described above, a case was described in which the third opening 16 is shifted toward one side in the longitudinal direction of the emitter layer 5, but the third opening 16 may be instead shifted toward the opposite side.

The presently disclosed embodiments are illustrative examples and embodiments of the present disclosure are not limited to these illustrative examples. The scope of the present disclosure is not defined by the above description but rather by the scope of the claims and it is intended that equivalents to the scope of the claims and all modifications within the scope of the claims be included within the scope of the present disclosure.

INDUSTRIAL APPLICABILITY

The present disclosure is effectively used in semiconductor devices that include a bipolar transistor.

The invention claimed is:

1. A semiconductor device comprising:
   a bipolar transistor including:
      a collector layer,
      a base layer on the collector layer,
      an emitter layer on the base layer,
      an emitter electrode on the emitter layer,
      a wiring line electrically connected to the emitter layer via the emitter electrode,
      an emitter wiring line electrically connected to the emitter layer via the wiring line,
      an insulating film covering the emitter wiring line and having an opening through which the emitter wiring line is exposed, the opening being arranged so as to overlap at least a portion of the emitter layer in plan view, and
      a rewiring line formed on the insulating film so as to bury the opening and electrically connected to the emitter layer via the emitter wiring line.

2. The semiconductor device according to claim 1, wherein
   the rewiring line is arranged so as to cover the emitter layer in plan view.

3. The semiconductor device according to claim 1, wherein
   a bump is formed on a part of the rewiring line and electrically connected to the rewiring line.

4. The semiconductor device according to claim 3, wherein
   the bump includes a pillar bump.

5. The semiconductor device according to claim 4, wherein
   the pillar bump at least includes a metal layer that is connected to the rewiring line, a metal post that is formed so as to contact the metal layer, and solder that is formed so as to contact the metal post.

6. The semiconductor device according to claim 4, further comprising:
   a mounting substrate on which the bipolar transistor is mounted, wherein
   the bump is connected to the mounting substrate.

7. The semiconductor device according to claim 4, further comprising:
   another insulating film covering the rewiring line and having a second opening through which the rewiring line is exposed, and the bump is connected to the rewiring line through the second opening.

8. The semiconductor device according to claim 7, wherein
   the pillar bump at least includes a metal layer that is connected to the rewiring line through the second opening, a metal post that is formed so as to contact the metal layer, and solder that is formed so as to contact the metal post.

9. The semiconductor device according to claim 1, wherein
   the wiring line is electrically connected to the emitter wiring line and is below the emitter wiring line, and
   a main material of the rewiring line is different from that of the wiring line.

10. The semiconductor device according to claim 1, wherein
    the bipolar transistor is a heterojunction bipolar transistor.

11. A semiconductor device comprising:
    a bipolar transistor including:
       a collector layer,
       a base layer on the collector layer, an emitter layer on the base layer, an emitter electrode on the emitter layer, a wiring line electrically connected to the emitter layer via the emitter electrode, a topmost wiring line electrically connected to the emitter layer via the emitter electrode and wiring line, an insulating film covering the topmost wiring line and having an opening through which the topmost wiring line is exposed, the opening being arranged so as to overlap at least a portion of the emitter layer in plan view, and a rewiring line formed on the insulating film so as to bury the opening and electrically connected to the emitter layer via the topmost wiring line.

12. The semiconductor device according to claim 11, wherein the rewiring line is arranged so as to cover the emitter layer in plan view.

13. The semiconductor device according to claim 11, wherein a bump is formed on a part of the rewiring line and electrically connected to the rewiring line.

14. The semiconductor device according to claim 13, wherein the bump includes a pillar bump.

15. The semiconductor device according to claim 14, wherein the pillar bump at least includes a metal layer that is connected to the rewiring line, a metal post that is formed so as to contact the metal layer, and solder that is formed so as to contact the metal post.

16. The semiconductor device according to claim 14, further comprising:

a mounting substrate on which the bipolar transistor is mounted, wherein the bump is connected to the mounting substrate.

17. The semiconductor device according to claim 11, wherein the wiring line is electrically connected to the topmost wiring line and below the topmost wiring line, wherein a main material of the rewiring line is different from that of the wiring line.

18. The semiconductor device according to claim 11, wherein the bipolar transistor is a heterojunction bipolar transistor.

19. The semiconductor device according to claim 11, further comprising:

a second insulating film having a second opening through which the wiring line is exposed to contact the topmost wiring line.

20. The semiconductor device according to claim 19, further comprising:

the topmost wiring line is formed on the second insulating film so as to bury the second opening.

\* \* \* \* \*